US010692834B2

(12) United States Patent
Kim et al.

(10) Patent No.: US 10,692,834 B2
(45) Date of Patent: Jun. 23, 2020

(54) METHOD FOR REPLACING CAPILLARY

(71) Applicant: SAMSUNG ELECTRONICS CO., LTD., Suwon-si, Gyeonggi-do (KR)

(72) Inventors: Youngsik Kim, Cheonan-si (KR); Doojin Kim, Asan-si (KR); Seokho Lee, Asan-si (KR); Younggon Hwang, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 202 days.

(21) Appl. No.: 15/853,170

(22) Filed: Dec. 22, 2017

(65) Prior Publication Data
US 2018/0294245 A1 Oct. 11, 2018

(30) Foreign Application Priority Data
Apr. 5, 2017 (KR) .......................... 10-2017-0044143

(51) Int. Cl.
H01L 23/00 (2006.01)
B23K 3/02 (2006.01)
(52) U.S. Cl.
CPC .............. H01L 24/78 (2013.01); B23K 3/02 (2013.01); H01L 24/85 (2013.01); H01L 24/45 (2013.01); H01L 2224/45144 (2013.01); H01L 2224/48463 (2013.01); H01L 2224/78308 (2013.01); H01L 2224/78611 (2013.01); H01L 2224/859 (2013.01); H01L 2224/85205 (2013.01); Y10T 29/5337 (2015.01); Y10T 29/53435 (2015.01); Y10T 29/53543 (2015.01)

(58) Field of Classification Search
CPC ......... Y10T 29/53543; Y10T 29/53365; Y10T 29/53378; Y10T 29/53435; Y10T 29/5337; H01L 2224/78308
See application file for complete search history.

(56) References Cited

U.S. PATENT DOCUMENTS

| 6,112,972 A * | 9/2000 | Koduri ................ B23K 20/004 228/180.5 |
| 6,215,195 B1 * | 4/2001 | Koduri ................ B23K 20/004 257/784 |
| 8,672,210 B2 * | 3/2014 | Kim ....................... H01L 24/78 228/4.5 |
| 8,812,154 B2 * | 8/2014 | Vian ..................... G07C 5/008 700/245 |

(Continued)

FOREIGN PATENT DOCUMENTS

| EP | 2472103 A2 * | 7/2012 | ............. F03D 80/50 |
| JP | 62213948 A * | 9/1987 | |

(Continued)

Primary Examiner — Jason L Vaughan
(74) Attorney, Agent, or Firm — F. Chau & Associates, LLC

(57) ABSTRACT

A method for replacing a capillary of a wire bonding apparatus that includes a holding unit that holds a capillary includes transferring a capillary replacing unit to the wire bonding apparatus by a mobile robot in response to receiving a capillary replacement start signal from the wire bonding apparatus, separating, by the capillary replacing unit, the capillary corresponding to the replacement signal from the wire bonding apparatus, and installing, by the capillary replacing unit, a new capillary in the wire bonding apparatus.

15 Claims, 25 Drawing Sheets

(56) References Cited

U.S. PATENT DOCUMENTS

| | | | | |
|---|---|---|---|---|
| 9,020,636 | B2* | 4/2015 | Tadayon | B25J 5/02 |
| | | | | 700/247 |
| 9,457,463 | B2* | 10/2016 | Tadayon | B25J 5/02 |
| 10,195,685 | B2* | 2/2019 | Tabio | H01L 24/78 |
| 2005/0267632 | A1* | 12/2005 | Waita | G06T 7/001 |
| | | | | 700/245 |
| 2007/0181651 | A1* | 8/2007 | Takahashi | B23K 20/005 |
| | | | | 228/101 |
| 2012/0152877 | A1* | 6/2012 | Tadayon | B25J 5/02 |
| | | | | 212/224 |
| 2012/0165985 | A1* | 6/2012 | Xia | F03D 80/50 |
| | | | | 700/259 |
| 2013/0185925 | A1* | 7/2013 | Sarh | B21J 15/142 |
| | | | | 29/559 |
| 2013/0221071 | A1* | 8/2013 | Kim | H01L 21/67138 |
| | | | | 228/4.5 |
| 2014/0109398 | A1 | 4/2014 | Choi | |
| 2018/0147721 | A1* | 5/2018 | Griffin | A47L 11/4011 |
| 2018/0315732 | A1* | 11/2018 | Takemoto | H01L 24/78 |

FOREIGN PATENT DOCUMENTS

| | | |
|---|---|---|
| JP | H06350287 | 12/1994 |
| JP | 2642075 | 8/1997 |
| JP | 3552810 | 8/2004 |
| JP | 2005236097 | 9/2005 |
| JP | 4700595 | 6/2011 |
| JP | 2015211997 | 11/2015 |
| KR | 2020090011422 | 11/2009 |
| KR | 100945672 | 3/2010 |

* cited by examiner

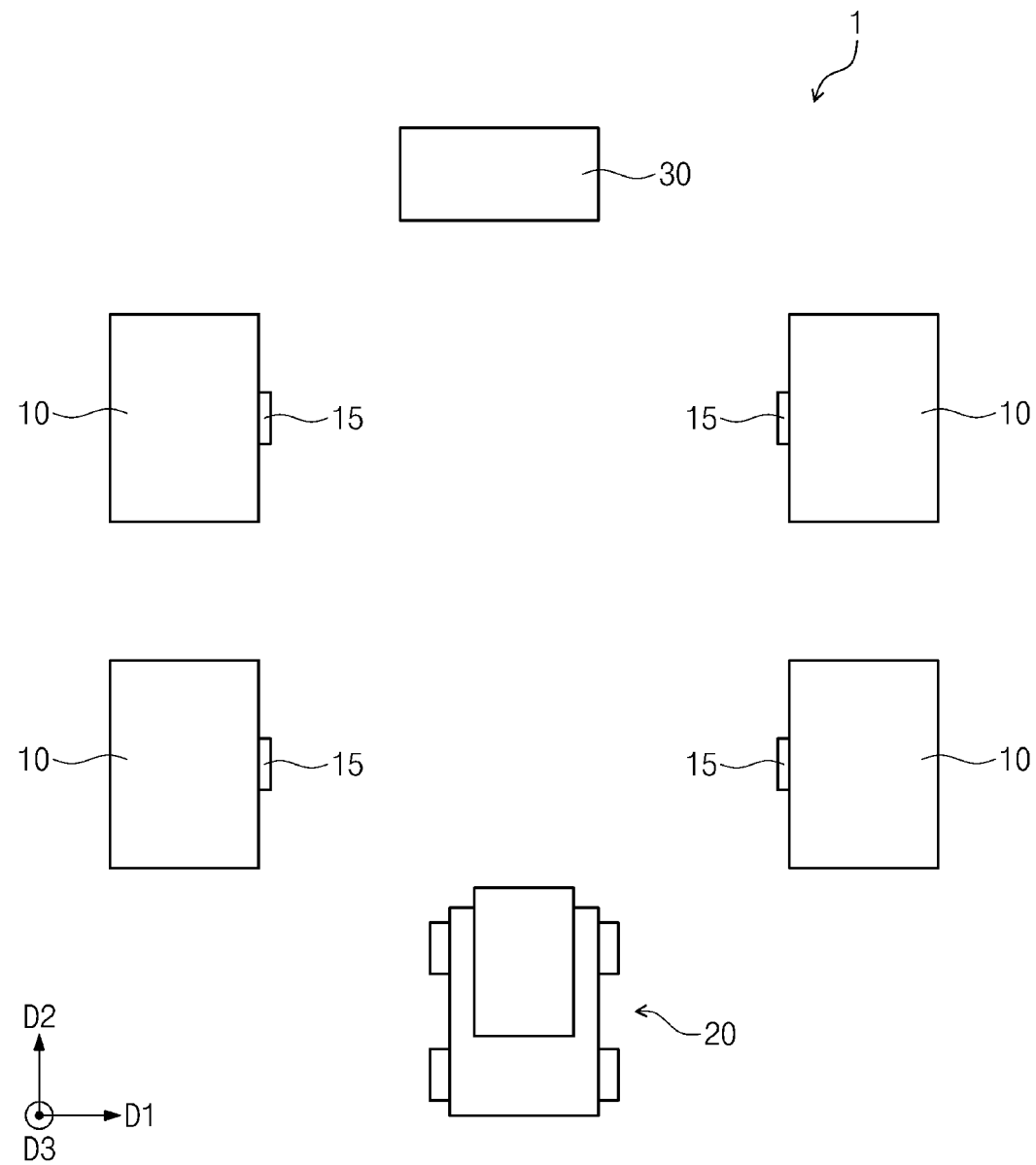

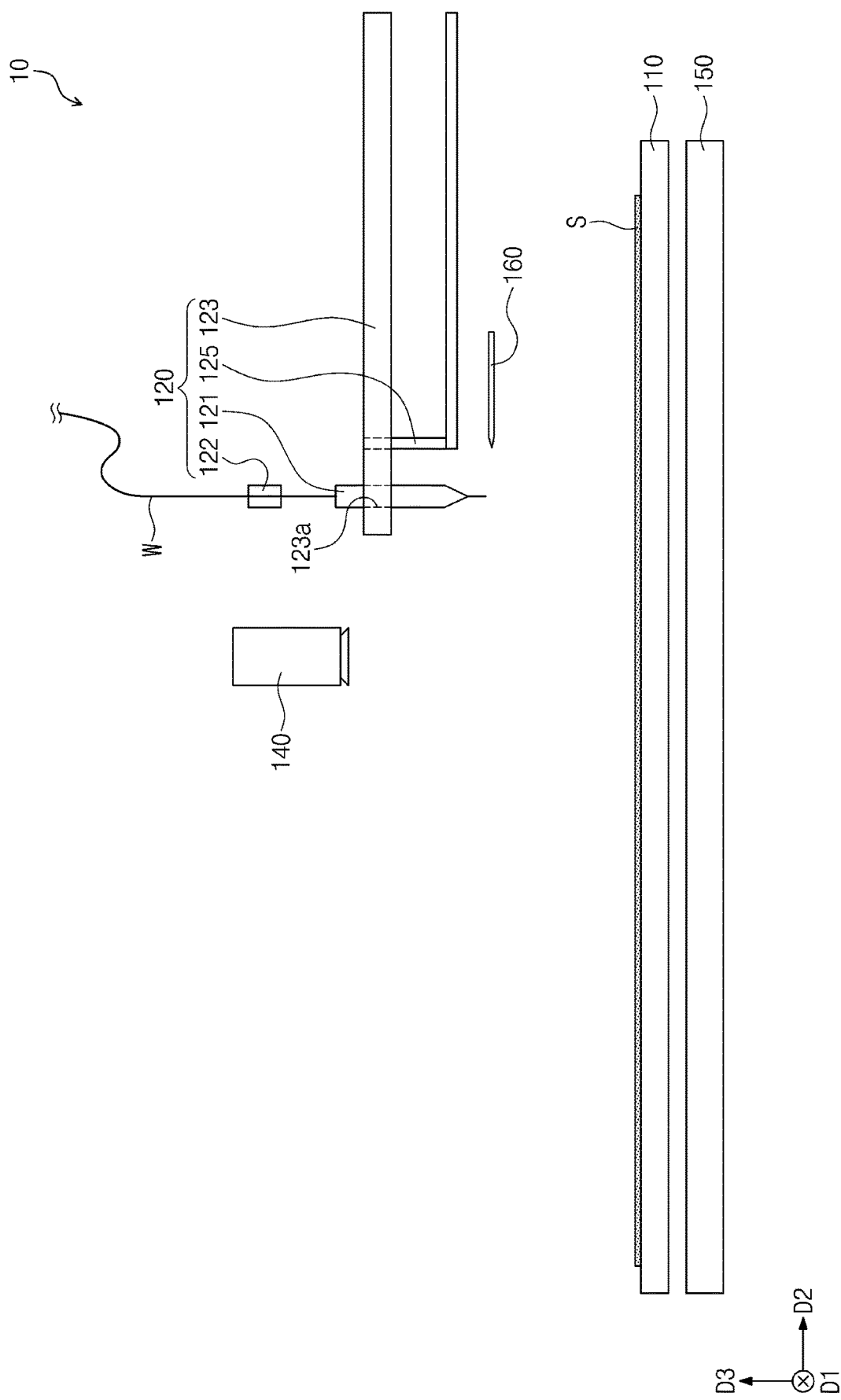

METHOD FOR REPLACING CAPILLARY

CROSS-REFERENCE TO RELATED APPLICATION

This U.S. non-provisional patent application claims priority under 35 § 119 from, and the benefit of, Korean Patent Application No, 10-2017-0044143, filed on Apr. 5, 2017 in the Korean Intellectual Property Office, the contents of which are herein incorporated by reference in their entirety.

BACKGROUND

Embodiments of the inventive concepts are directed to a method for replacing a capillary.

A wire bonding process may be part of the processes for manufacturing a semiconductor package. A semiconductor chip may be electrically connected to a substrate by a gold wire by a wire bonding process, and thus electrical signals can be transmitted between the semiconductor chip and the substrate. Thus, the semiconductor package may have electrical characteristics.

A capillary used in a wire bonding process is a fine tube that directly bonds a gold wire along a trajectory on which the gold wire will be disposed. Since this capillary is a consumable part with limited use time, it is a replacement part that needs to be replaced with a new one when its life has ended.

In the conventional art, a worker manually replaces a capillary of a wire bonding apparatus with a new one. For example, when a capillary replacement signal is received from a wire bonding apparatus, a worker recognizes the replacement signal and replaces a capillary with a new one. This, however, increases the time for replacing a capillary. In addition, since the capillary is manually replaced, installation errors may occur, which can increase the failure rate of products while the work is incomplete.

SUMMARY

Embodiments of the inventive concepts can provide a method for automatically replacing a capillary.

According to an embodiment, a method for replacing a capillary of a wire bonding apparatus that includes a holding unit that holds a capillary includes: transferring a capillary replacing unit to the wire bonding apparatus by a mobile robot in response to receiving a capillary replacement start signal from the wire bonding apparatus, separating, by the capillary replacing unit, the capillary corresponding to the replacement signal from the wire bonding apparatus, and installing, by the capillary replacing unit, a new capillary in the wire bonding apparatus.

According to an embodiment, a method for replacing a capillary of a wire bonding apparatus using a capillary replacing unit loaded on a mobile robot includes: receiving a capillary replacement start signal from at least one of a plurality of wire bonding apparatuses, autonomously moving the mobile robot that received the replacement start signal to the wire bonding apparatus that transmitted the replacement start signal to load the capillary replacing unit onto the wire bonding apparatus, separating, by the capillary replacing unit, the capillary corresponding to the replacement start signal from the wire bonding apparatus, and installing, by the capillary replacing unit a new capillary in the wire bonding apparatus.

According to an embodiment, a capillary replacing apparatus includes: a capillary replacing unit that replaces a capillary of a wire bonding apparatus, and a mobile robot that transfers the capillary replacing unit to the wire bonding apparatus in response to receiving a replacement start signal from the wire bonding apparatus. The capillary replacing unit includes a gripper that grips a capillary, a cradle with a plurality of holes that hold new capillaries, a collection container that receives used capillaries, and a transfer unit that moves the gripper to and from the cradle or the collection container.

BRIEF DESCRIPTION OF THE DRAWINGS

FIG. 1 is a schematic view that illustrates a capillary replacing system according to some embodiments of the inventive concepts.

FIG. 2A is a schematic view that illustrates a wire bonding apparatus of FIG. 1.

DETAILED DESCRIPTION OF EXEMPLARY EMBODIMENTS

Figure 2B:
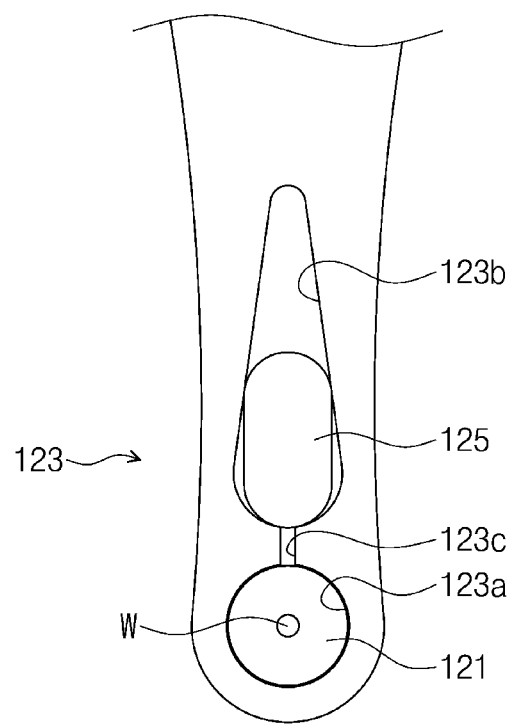
FIG. 2B is a plan view that illustrates a holding unit of FIG. 2A.

Exemplary embodiments of the inventive concepts will be described hereinafter in detail with reference to the accompanying drawings.

FIG. 1 is a schematic view that illustrates a capillary replacing system according to some embodiments of the inventive concepts.

Referring to FIG. 1, a capillary replacing system 1 according to some embodiments of the inventive concepts includes a wire bonding apparatus 10 and a capillary replacing apparatus 20. The capillary replacing system 1 further includes a server 30.

The wire bonding apparatus 10 performs a wire bonding process of connecting a chip and a substrate by a wire. In some embodiments, there may be a plurality of wire bonding apparatuses 10. The wire bonding apparatuses 10 are disposed to be spaced apart from each other.

In some embodiments, the wire bonding apparatus 10 performs a wire bonding process by using two or more types of capillaries. For example, the wire bonding apparatus 10 can perform a wire bonding process by using a first capillary having a first diameter and a second capillary having a second diameter that differs from the first diameter. The wire bonding apparatus 10 has a position mark 15. This will be described below in detail.

In some embodiments, the wire bonding apparatus 10 determines whether a capillary in use, hereinafter referred to as 'a use capillary,' needs to be replaced. The wire bonding apparatus 10 transmits a replacement signal when the replacement of the use capillary is needed. The wire bonding apparatus 10 will be described below in detail with reference to FIGS. 2 and 3.

In some embodiments, the capillary replacing apparatus 20 moves to the wire bonding apparatus 10 that is transmitting the replacement signal to replace the use capillary with a new capillary. The capillary replacing apparatus 20 moves autonomously on an X-Y plane. In the present specification, an X-axis direction is defined as a first direction D1, a Y-axis direction is defined as a second direction D2, and a Z-axis direction is defined as a third direction D3. In the present specification, it is understood that when a component, element or apparatus is referred to as moving autonomously, it automatically moves to a predetermined position along an unspecified path. The capillary replacing apparatus 20 will be described below in more detail with reference to FIGS. 4A, 4B, and 5 to 9.

In some embodiments, the server 30 receives the replacement signal transmitted from the wire bonding apparatus 10. The server 30 transmits the received replacement signal to the capillary replacing apparatus 20. The server 30 stores information or data included in the replacement signal.

In some embodiments, the capillary replacing system automatically replaces a capillary with a new one by using the capillary replacing apparatus 20 when the capillary of the wire bonding apparatus 10 needs replacing. The capillary replacing system 1 takes less time to replace a capillary than a worker who manually replaces the capillary. Since the capillary replacing system 1 reduces the replacement time of the capillary, efficiency of a wire bonding process can be improved and productivity of a semiconductor manufacturing process can be improved.

Figure 3:
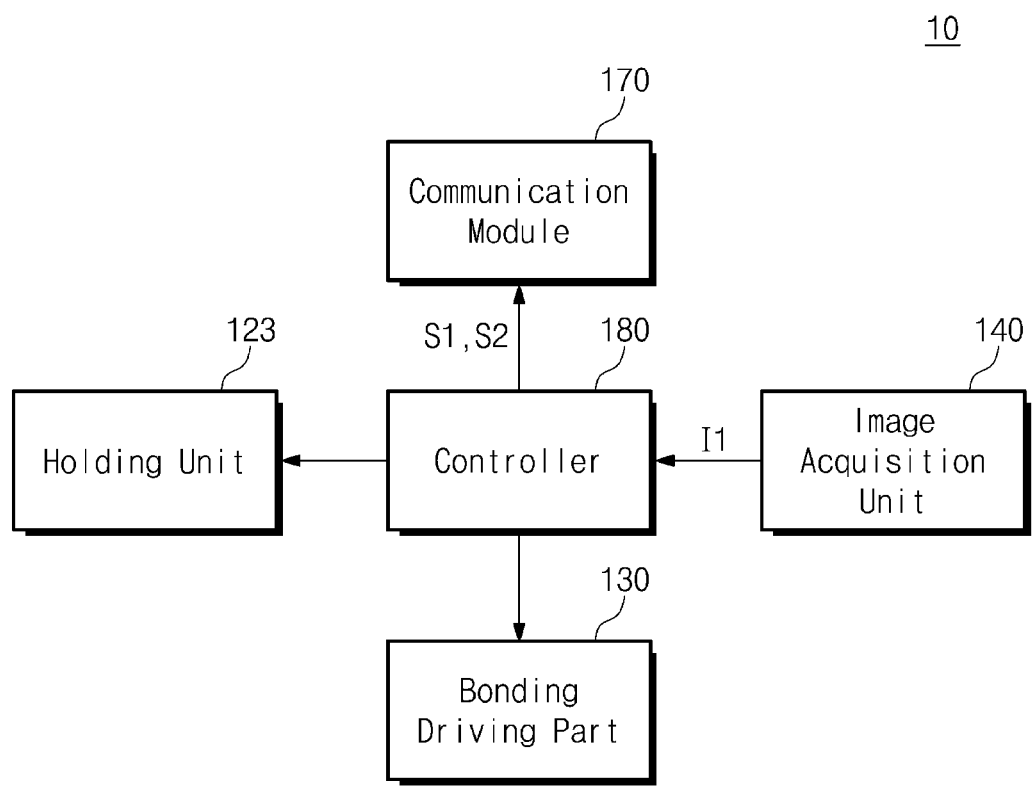
FIG. 3 is a block diagram that illustrates some components of a wire bonding apparatus of FIG. 1.

FIG. 2A is a schematic view that illustrates a wire bonding apparatus of FIG. 1. FIG. 2B is a plan view that illustrates a holding unit of FIG. 2A. FIG. 3 is a block diagram that illustrates some components of the wire bonding apparatus of FIG. 1.

Referring to FIGS. 1, 2A, 2B, and 3, in some embodiments, the wire bonding apparatus 10 includes a support member 110, a bonding unit 120, a bonding driving part 130, an image acquisition unit 140, and a heating unit 150. The wire bonding apparatus 10 further includes a discharge unit 160, a communication module 170, and a controller 180.

Figure 14:
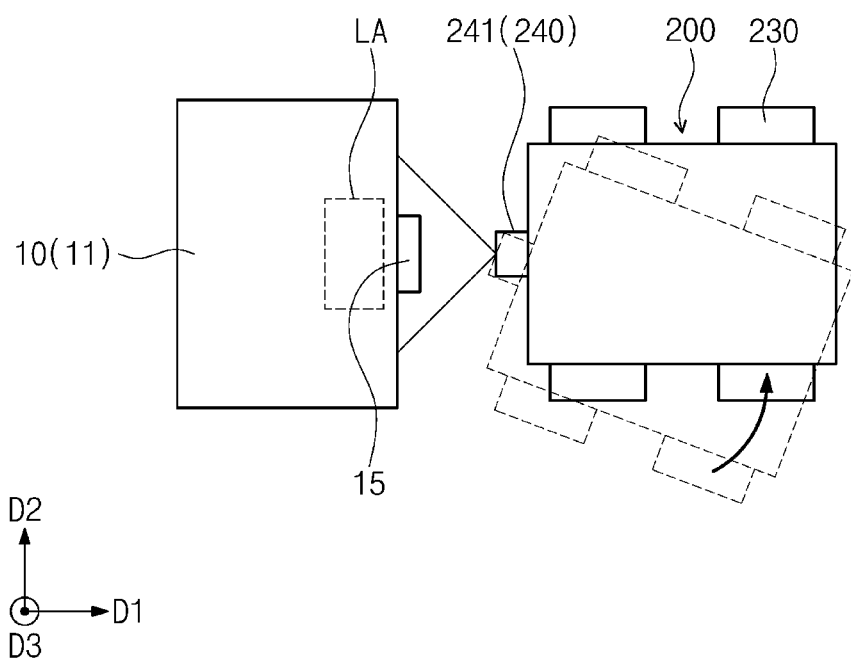

In some embodiments, the support member 110 supports a substrate S. The support member 110 includes a loading area LA (see FIG. 14) on which a capillary replacing unit 400 (see FIGS. 4A and 4B) to be described below is loaded. The support member 110 supports the capillary replacing unit 400. The support member 110 is positioned under the bonding unit 120 and the image acquisition unit 140. The support member 110 is positioned on the heating unit 150. The support member 110 is spaced apart from the heating unit 150.

In some embodiments, the bonding unit 120 bonds a wire W, which is supplied from a wire supply unit, to the substrate S. A plurality of bonding units 120 may be provided. Each of the bonding units 120 includes a capillary 121, a clamp 122, and a holding unit 123. Each of the bonding units 120 further includes a transducer that provides ultrasonic vibrations to the holding unit 123.

In some embodiments, the capillary 121 provides the wire W supplied from the wire supply unit toward the substrate S. The capillary 121 has a through-hole through which the wire W passes. The clamp 122 is positioned over the capillary 121. In other words, the clamp 122 is spaced apart from the capillary 121. The clamp 122 can clamp or unclamp the wire W between the capillary 121 and the wire supply unit.

In some embodiments, the holding unit 123 holds or releases the capillary 121. For example, the holding unit 123 includes a first insertion hole 123a in which the capillary 121 is inserted. The holding unit 123 also includes a second insertion hole 123a spaced apart from the first insertion hole 123a, a connection slit 123c that connects the first and second insertion holes 123a and 123b, and a pin 125 that can rotate in the second insertion hole 123b.

In some embodiments, the pin 125 has a substantially elliptical shape when viewed in a plan view. The diameters of the first and second insertion holes 123a and 123a and a width of the connection slit 123c can be increased or decreased by rotation of the pin 125. Thus, when the diameter of the first insertion hole 123a is decreased, the capillary 121 can be held in the holding unit 123. When the diameter of the first insertion hole 123a is increased, the capillary 121 can be separated from the holding unit 123. The holding unit 123 is relatively longer in one direction than another direction. As illustrated in FIG. 2A, the holding unit 123 extends along the second direction D2, but embodiments are not limited thereto. For example, the holding unit 123 may extend along the first direction D1.

In some embodiments, the bonding driving part 130 moves the bonding unit 120 or the image acquisition unit 140 over the substrate S or the support member 110. For example, the bonding driving part 130 can move the holding unit 123 along the first to third directions D1, D2, and D3.

In some embodiments, the image acquisition unit 140 is positioned over the support member 110. The image acquisition unit 140 is vertically spaced apart from a top surface of the support member 110. The image acquisition unit 140 is separated from the holding unit 123 by a predetermined distance. For example, the image acquisition unit 140 can be separated from a center of the first insertion hole 123a by a predetermined distance.

In some embodiments, the image acquisition unit 140 acquires an image of a gripper 420 (see FIG. 6) of the capillary replacing apparatus 20. The image acquisition unit 140 obtains first image information I1 and transmits the first image information I1 to the controller 180. The first image information I1 includes information of a position of the gripper 420 to be described below or information of a position of a capillary gripped by the gripper 420.

In some embodiments, the heating unit 150 is positioned under the support member 110. The heating unit 150 provides heat to the substrate S disposed on the support member 110.

In some embodiments, the discharge unit 160 is disposed between the bonding unit 120 and the support member 110. The discharge unit 160 provides a discharge voltage to an end of the wire W provided from the capillary 121. A bump ball is formed at the end of the wire W by the discharge voltage. The discharge unit 160 is a high-voltage generator, such as an electro-flame-off (EFO). However, embodiments of the inventive concepts are not limited thereto.

In some embodiments, the controller 180 controls the components of the wire bonding apparatus 10. For example, the controller 180 can control the bonding unit 120, the holding unit 123, the bonding driving part 130, and the discharge unit 160. The controller 180 generates a replacement start signal S1 for the capillary on the basis of capillary use information. The controller 180 generates the replacement start signal S1 for the capillary when at least one of a use time of the capillary and a number of uses of the capillary corresponds to a predetermined reference value. For example, the controller 180 generates the replacement start signal S1 when the number of uses of the capillary is equal to or greater than a predetermined reference value.

In some embodiments, the controller 180 generates a replacement complete signal S2 after the capillary 121 of the wire bonding apparatus 10 is replaced with a new one. The controller 180 transmits the replacement start signal S1 and the replacement complete signal S2 to the communication module 170.

Figure 13:
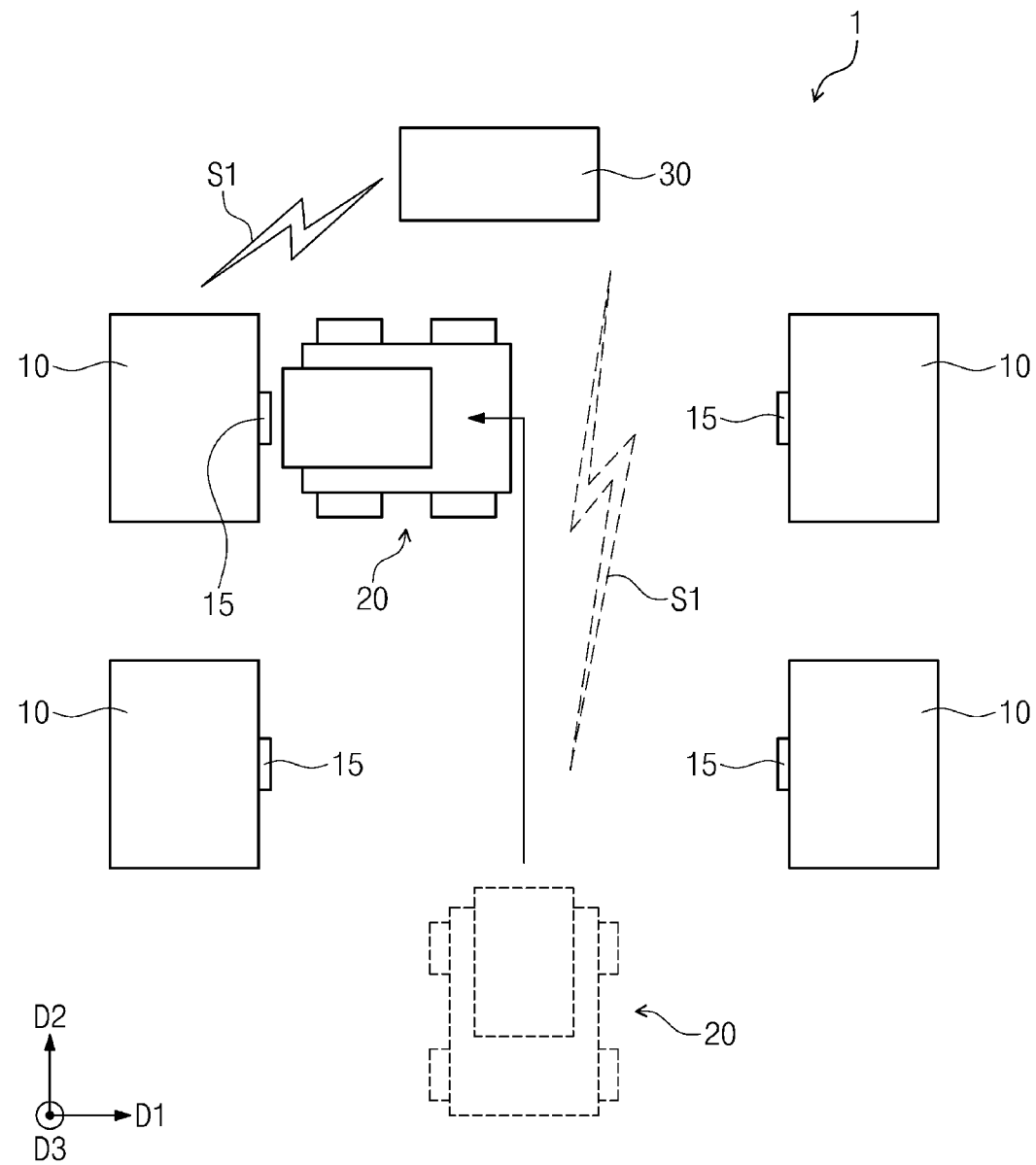
FIGS. 13 to 24 are schematic views that illustrate processes of replacing a capillary by a capillary replacing system of FIG. 1.

In some embodiments, the controller 180 receives the first image information I1 from the image acquisition unit 140. The controller 180 analyzes the first image information I1 to determine whether the gripper 420 and the holding unit 123 are aligned with each other. When the gripper 420 is not aligned with the holding unit 123, the controller 180 aligns the gripper 420 and the holding unit 123 with each other. This will be described below in more detail with reference to FIGS. 13 to 15.

In some embodiments, the communication module 170 transmits the replacement start signal S1 or the replacement complete signal S2 to the server 30 or the capillary replacing apparatus 20. The communication module 170 may communicate wirelessly.

Figure 4A:
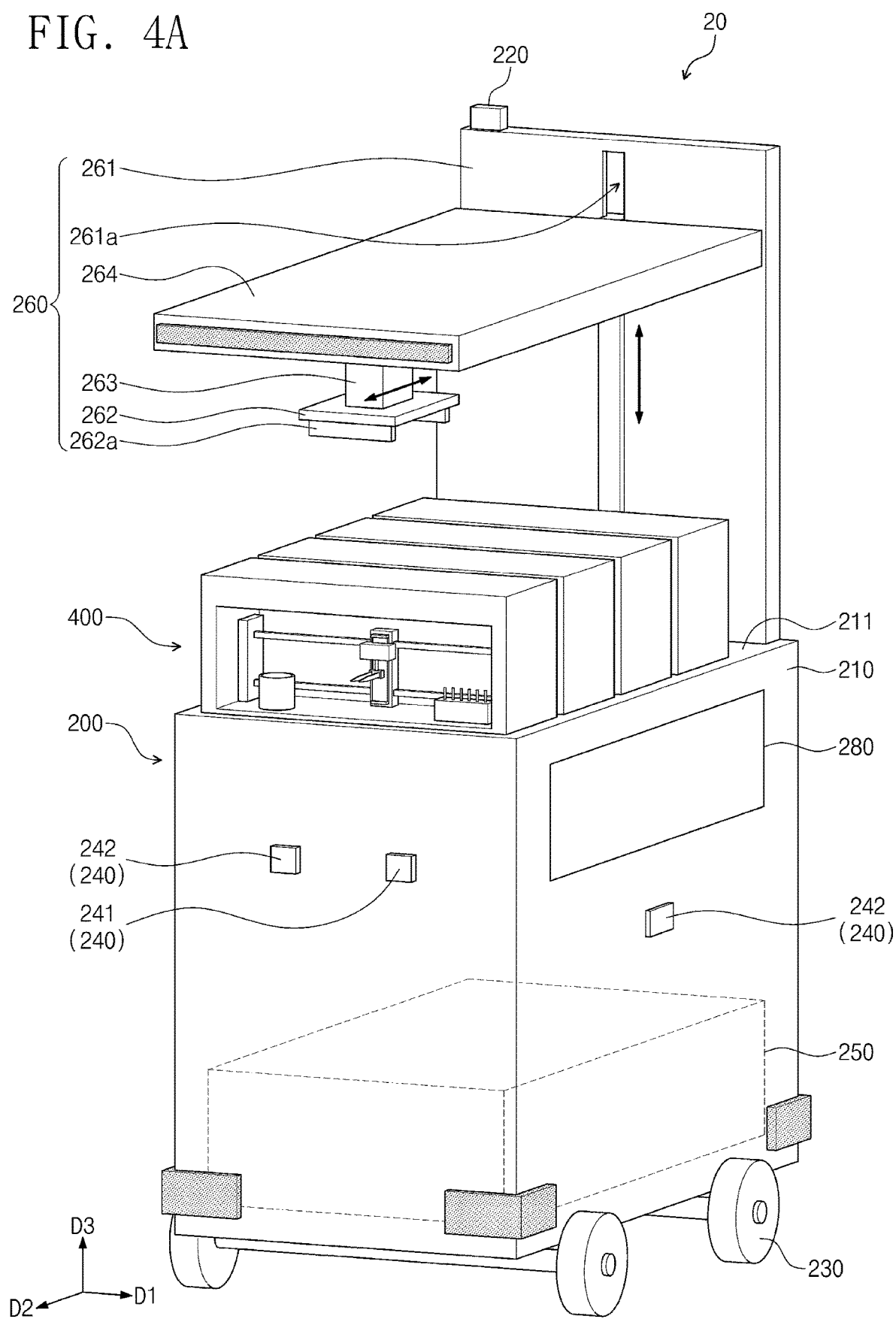
FIG. 4A is a perspective view that illustrates a capillary replacing apparatus of FIG. 1.
Figure 4B:
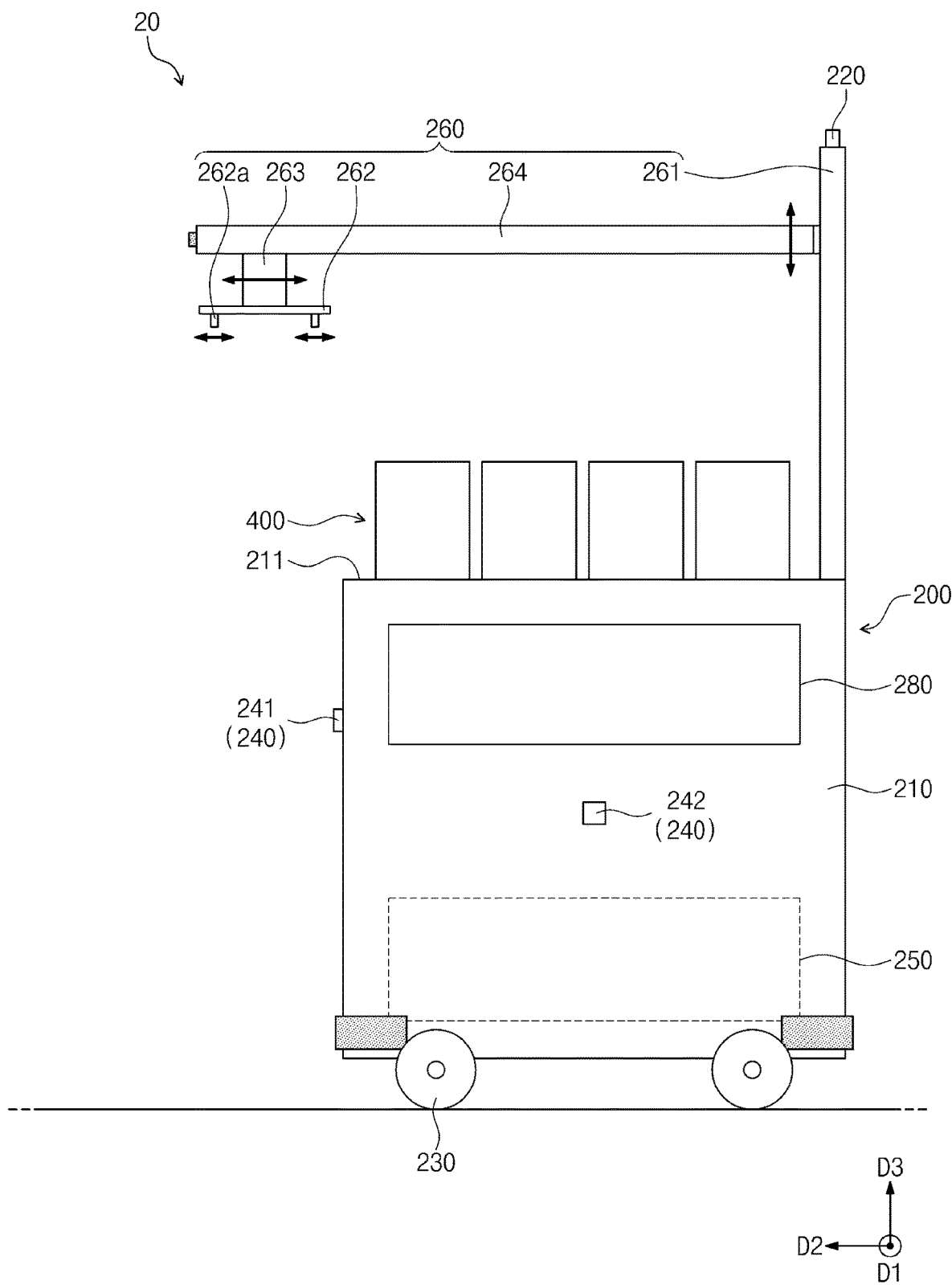
FIG. 4B is a side view that illustrates a capillary replacing apparatus of FIG. 1.
Figure 5:
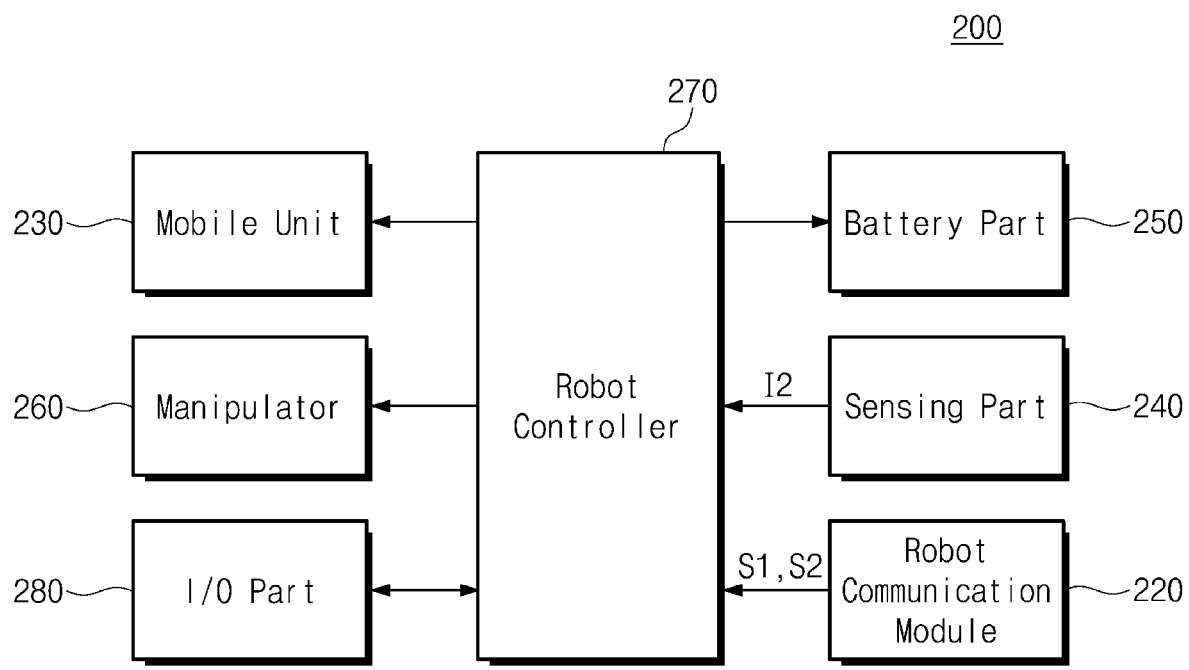
FIG. 5 is a block diagram that illustrates some components of a mobile robot of FIG. 4.

FIG. 4A is a perspective view that illustrates a capillary replacing apparatus of FIG. 1. FIG. 4B is a side view that illustrates the capillary replacing apparatus of FIG. 1. FIG. 5 is a block diagram that illustrates some components of a mobile robot of FIG. 4.

Referring to FIGS. 1, 4A, 4B, and 5, in some embodiments, the capillary replacing apparatus 20 includes a mobile robot 200 and the capillary replacing unit 400.

In some embodiments, the mobile robot 200 transfers the capillary replacing unit 400 to the wire bonding apparatus 10 that transmits the replacement start signal S1 (see FIG. 3) in response to the replacement start signal S1. Hereinafter, the wire bonding apparatus 10 that transmits the replacement start signal S1 is referred to as 'a first wire bonding apparatus'. In some embodiments, a plurality of capillary replacing units 400 are loaded on the mobile robot 200. The mobile robot 200 moves autonomously toward the first wire bonding apparatus 10 without an additional guide. The mobile robot 200 is positioned to correspond to the first wire bonding apparatus 10. When adjacent to the first wire bonding apparatus 10, the mobile robot 200 picks up one of the loaded capillary replacing units 400 and places the one capillary replacing unit 400 onto the first wire bonding apparatus 10.

In some embodiments, the mobile robot 200 includes a body part 210, a robot communication module 220, a mobile unit 230, and a robot controller 270. The mobile robot 200 further includes a sensing part 240, a battery part 250, a manipulator 260, and an input/output (I/O) part 280.

In some embodiments, the body part 210 provides the outward shape of the mobile robot 200. The body part 210 has, but is not limited to, a substantially rectangular parallelepiped shape. Various parts can be installed in or on the body part 210. The body part 210 supports the capillary replacing unit 400. For example, the capillary replacing unit 400 can be loaded onto a top surface 211 of the body part 210.

In some embodiments, the mobile unit 230 is installed on the body part 210. The mobile unit 230 enables the body part 210 to move. In other words, the mobile unit 230 is one of various means that enable the body part 210 to move. For example, the mobile unit 230 may include a plurality of wheels and a mobile driving part connected to the wheels. The mobile driving part may be a driving motor capable of rotating the wheels.

In some embodiments, the robot communication module 220 is installed on or in the body part 210. The robot communication module 220 can communicate wirelessly with the server 30 or the communication module 170 of the wire bonding apparatus 10 (see FIG. 3). The robot communication module 220 receives the replacement start signal S1 or the replacement complete signal S2 from the wire bonding apparatus 10. In some embodiments, the communication module 170 of the wire bonding apparatus 10 and the robot communication module 220 may be a local communication module, a radio-frequency identification (MD) communication module, or a wireless fidelity (WiFi) communication module.

In some embodiments, the sensing part 240 senses the position mark 15 of the wire bonding apparatus 10. The sensing part 240 can sense an obstacle located in a path of the moving mobile robot 200. For example, the sensing part 240 can acquire an image of the position mark 15 or the obstacle to obtain second image information I2.

In some embodiments, the sensing part 240 is installed on the body part 210. The sensing part 240 includes a mark sensing unit 241 that can sense the position mark 15 and an obstacle sensing unit 242 that can sense an obstacle located near the mobile robot 200.

In some embodiments, the mark sensing unit 241 is installed on a front surface of the body part 210. In a present embodiment, the front surface of the body part 210 is a surface positioned in the moving direction of the mobile robot 200. The mark sensing unit 241 acquires an image of the position mark 15 of the first wire bonding apparatus 10 when the mobile robot 200 is positioned adjacent to the first wire bonding apparatus 10. The mark sensing unit 241 may be one of various types of image acquisition units capable of acquiring an image. The mark sensing unit 241 transmits the acquired image information to the robot controller 270.

In some embodiments, the obstacle sensing unit 242 is installed on each of the front surface and side surfaces of the body part 210. The obstacle sensing unit 242 may be any of various types of distance sensors and cameras that can sense an obstacle. For example, the obstacle sensing unit 242 may be an ultrasonic sensor, a laser sensor, an infrared sensor, or a camera.

In some embodiments, the battery part 250 supplies electrical energy to the mobile unit 230 and the manipulator 260. The battery part 250 includes a rechargeable secondary battery. The battery part 250 may be installed inside or outside the body part 210. The battery part 250 transmits information on the stored electrical energy to the robot controller 270.

In some embodiments, the manipulator 260 is installed on the body part 210. The manipulator 260 can load or unload the capillary replacing unit 400 on or from the mobile robot 200. The manipulator 260 includes a support part 261 disposed on the body part 210, an arm part 262 that grips the capillary replacing unit 400, an arm transfer part 263 connected to the arm part 262, and an arm elevating part 264 that can elevate and lower the arm transfer part 263 along the support part 261.

In some embodiments, the support part 261 extends in the third direction D3. The support part 261 includes a guide part 261a that extends in the third direction D3. The guide part 261a has a groove shape. Alternatively, in other embodiments, the guide part 261a has a rail shape.

In some embodiments, the arm part 262 is connected to the arm transfer part 263. The arm part 262 is capable of gripping the capillary replacing unit 400. For example, the arm part 262 includes fingers 262a that can grip the capillary replacing unit 400.

In some embodiments, the arm elevating part 264 moves along the guide part 261a. For example, the arm elevating part 264 can move the arm transfer part 263 in a direction toward the body part 210 or a direction away from the body part 210. Thus, the arm elevating part 264 moves the arm part 262 parallel to the third direction D3.

In some embodiments, the arm transfer part 263 moves on the arm elevating part 264. The arm part 262 is moved along the first direction D1 or the second direction D2 by the arm transfer part 263. For example, the arm transfer part 263 moves the arm part 262 in a direction toward the support part 261 or a direction away from the support part 261.

In some embodiments, the mobile robot 200 further includes the I/O part 280 that receives user commands. In addition, the I/O part 280 outputs a status of the mobile robot 200. For example, the I/O part 280 can be a touch screen. The I/O part 280 is installed on the body part 210.

In some embodiments, the mobile robot 200 further includes a bump part that absorbs an external impact. The bump part is positioned at a corner of the body part 210. Thus, it is possible to reduce damage to or breakage of the body part 210 caused by an external impact. The bump part may be Styrofoam or an elastic member.

In some embodiments, the capillary replacing unit 400 is positioned on the mobile robot 200. For example, the capillary replacing unit 400 can be loaded on the top surface 211 of the body part 210. Alternatively, in other embodiments, the capillary replacing unit 400 is connected to the rear of the mobile robot 200 and is moved by the mobile robot 200.

In some embodiments, a plurality of capillary replacing units 400 are provided. Each of the plurality of capillary replacing units 400 can replace the same type of capillary. Alternatively, in other embodiments, the type of capillary replaced by one of the capillary replacing units 400 may differ from that of a capillary replaced by other capillary replacing units 400.

In some embodiments, the capillary replacing unit 400 is transferred to the first wire bonding apparatus 10 by the mobile robot 200. The capillary replacing unit 400 transferred to the first wire bonding apparatus 10 can replace the capillary of the first wire bonding apparatus 10 with a new one. The capillary replacing unit 400 will be described below in more detail.

Figure 6:
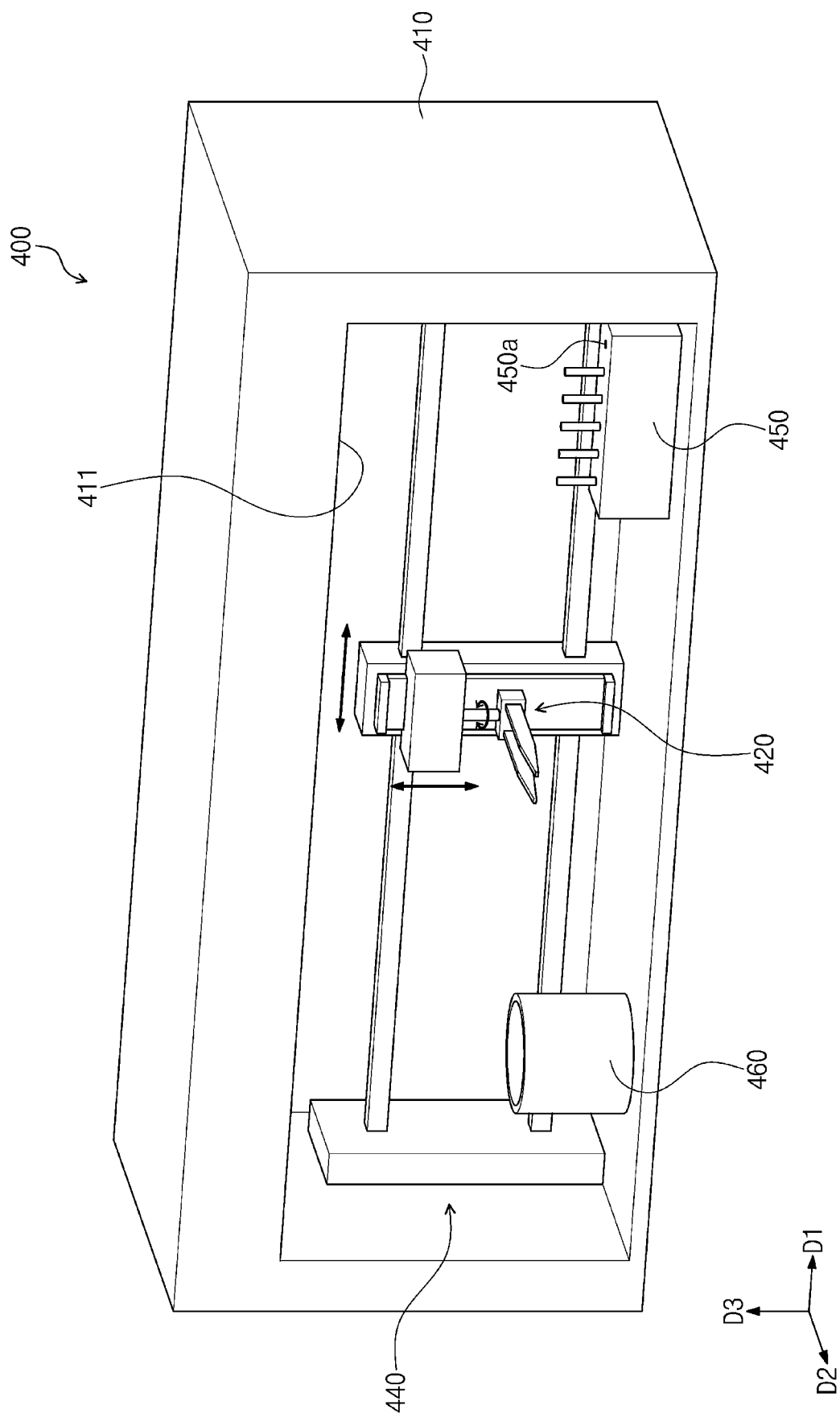
FIG. 6 is a perspective view that illustrates a capillary replacing unit of FIG. 5.
Figure 7:
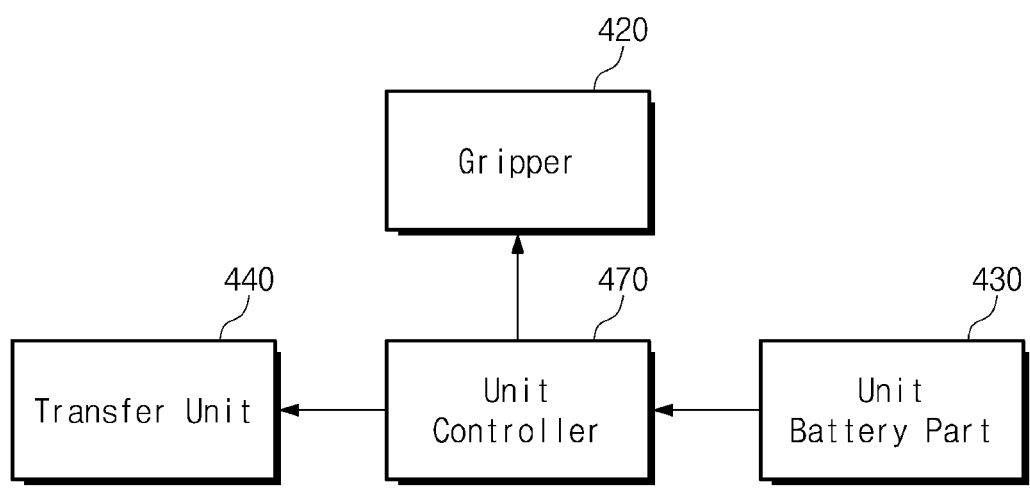
FIG. 7 is a block diagram that illustrates some components of a capillary replacing unit of FIG. 6.
Figure 8:
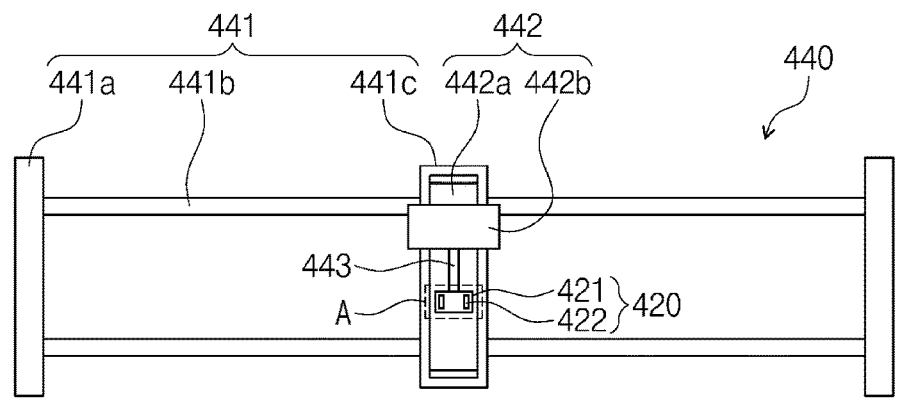
FIG. 8 is a front view that illustrates a transfer unit and a gripper of FIG. 6.
Figure 9:
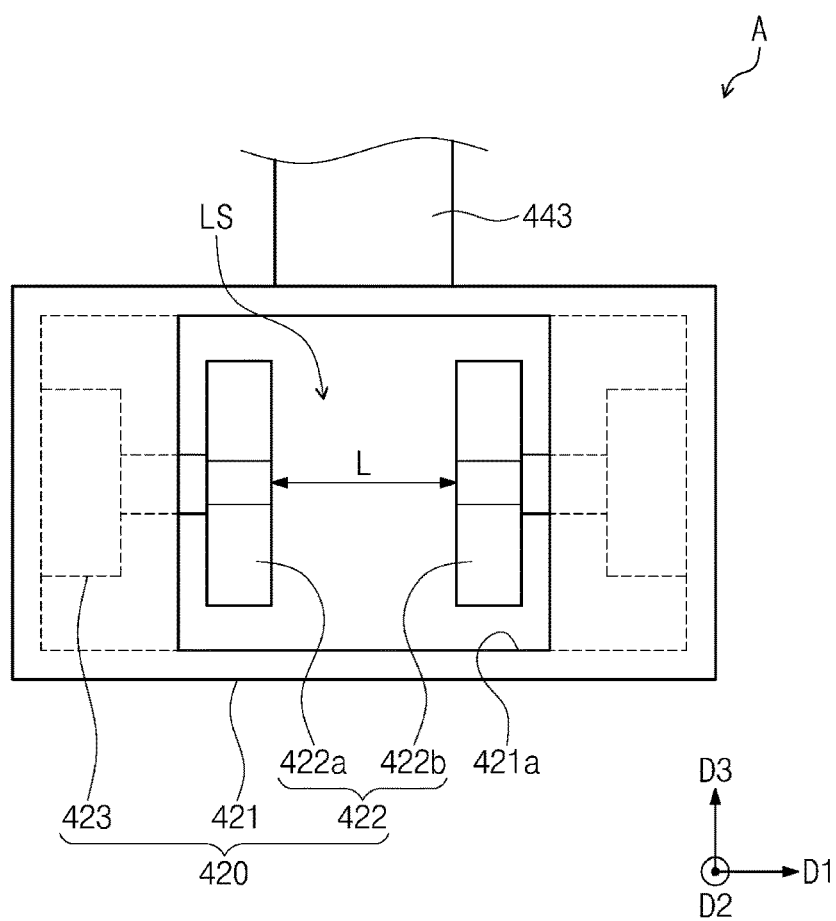
FIG. 9 is an enlarged view of a region 'A' of FIG. 8.

FIG. 6 is a perspective view that illustrates a capillary replacing unit of FIG. 5. FIG. 7 is a block diagram that illustrates some components of the capillary replacing unit of FIG. 6. FIG. 8 is a front view that illustrates a transfer unit and a gripper of FIG. 6. FIG. 9 is an enlarged view of a region 'A' of FIG. 8.

Referring to FIGS. 4A, 4B, and 6 to 9, in some embodiments, the capillary replacing unit 400 includes a housing 410, a gripper 420, a transfer unit 440, a cradle 450, a collection container 460, and a unit controller 470. The capillary replacing unit 400 further includes a unit battery part 430.

In some embodiments, the housing 410 has an inner space. The gripper 420, the unit battery part 430, the transfer unit 440, the cradle 450, the collection container 460, and the unit controller 470 are installed in the inner space of the housing 410. The housing 410 has an opening 411 formed in one side of the housing 410.

In some embodiments, the gripper 420 grips a capillary. The gripper 420 is any one of various means capable of gripping the capillary. For example, the gripper 420 can include a grip head 421, a pair of grip members 422, and a grip driving part 423.

In some embodiments, the grip members 422 are coupled to the grip head 421. The grip head 421 is coupled to a grip elevating part 442 to be described below. The grip head 421 has an insertion opening 421a in which the pair of grip members 422 is inserted.

In some embodiments, the pair of grip members 422 include a first grip member 422a and a second grip member 442b. The first and second grip members 422a and 422b are spaced apart from each other. Thus, a space LS can be formed between the first and second grip members 422a and 422b. Each of the first and second grip members 422a and 422b extends in one direction.

In some embodiments, the grip driving part 423 is installed in the grip head 421. The grip driving part 423 adjusts a distance L between the grip members 422. For example, the distance L between the grip members 422 can be changed from about 50 mm to about 75 mm. The grip driving part 423 includes a pair of ultrasonic motors respectively coupled to the ends of the grip members 422.

In some embodiments, when the distance L between the grip members 422 is reduced by the grip driving part 423, the grip members 423 can grip the capillary. When the distance L between the grip members 422 is increased by the grip driving part 423, the capillary gripped by the grip members 422 is released by the grip members 422.

In some embodiments, the transfer unit 440 moves the gripper 420. For example, the transfer unit 440 can move the gripper 420 toward the collection container 460 or the cradle 450. The transfer unit 440 includes a grip transfer part 441, a grip elevating part 442, and a grip rotating part 443. In other embodiments, the grip rotating part 443 is omitted.

In some embodiments, the grip transfer part 441 moves the gripper 420 parallel to the first direction D1. The grip transfer part 441 includes a pair of supporters 441a, a transfer rail part 441b coupled to the supporters 441a, a transfer tray 441c, and a transfer driving part.

In some embodiments, the pair of supporters 441a are spaced apart from each other to be positioned at opposite ends of the inner space of the housing 410 of the capillary replacing unit 400. For example, the pair of supporters 441a include a first supporter and a second supporter. The first supporter is spaced apart from the second supporter in the first direction D1.

In some embodiments, the transfer rail part 441b includes first and second rails spaced apart from each other. Each of the first and second rails connects the pair of supporters 441a. The first rail is spaced apart from the second rail in the second direction D2.

In some embodiments, the transfer tray 441c is coupled to the first and second rails. The transfer tray 441c is moved along the transfer rail part 441b by the transfer driving part. The transfer driving part is a driving motor that provides a driving force to the transfer tray 441c.

In some embodiments, the grip elevating part 442 is coupled to the grip transfer part 441. The grip elevating part 442 elevates and lowers the gripper 420. For example, the grip elevating part 442 can move the gripper 420 parallel to the third direction D3. The grip elevating part 442 includes an elevating rail part 442a, an elevating tray 442b, and an elevating driving part.

In some embodiments, the elevating rail part 442a is positioned on the transfer tray 441c. The elevating rail part 442a extends in the third direction D3. The elevating tray 442b is moved along the elevating rail part 442a by the elevating driving part.

In some embodiments, the grip rotating part 443 is coupled to the grip elevating part 442 and the gripper 420. The grip rotating part 443 rotates the gripper 420. For example, the grip rotating part 443 includes a rotation shaft coupled to the grip head 421 and a rotation motor that rotates the rotation shaft. Since the grip head 421 is rotated by the grip rotating part 443, other ends of the grip members 442 move along an arc-shaped trajectory.

In some embodiments, each of the elevating driving part and the transfer driving part can be, but are not limited to, a linear motor or an ultrasonic motor.

In some embodiments, the cradle 450 is positioned on a movement path of the gripper 420. For example, the cradle 450 can be positioned adjacent to the first supporter of the pair of supporters 441a. The cradle 450 provides a new capillary to the gripper 420. The cradle 450 can hold two or more types of new capillaries. The cradle 450 has a plurality of holes 450a in which new capillaries are inserted.

In some embodiments, the collection container 460 collects a used capillary that was separated from the wire bonding apparatus 10 (see FIG. 1). The collection container 460 is located on the movement path of the gripper 420. For example, the collection container 460 is located adjacent to the second supporter of the pair of supporters 441a. The collection container 460 is spaced apart from the cradle 450 in the first direction D1.

In some embodiments, the unit controller 470 controls some components of the capillary replacing unit 400. The unit controller 470 controls the gripper 420 and the transfer unit 440. For example, the unit controller 470 controls the driving of the grip driving part 423, the transfer driving part, the elevating driving part and the grip rotating part 443.

In some embodiments, the wire bonding process is a precise process that bonds a wire to a nano and/or micro-sized electrode. Thus, if a worker manually replaces a capillary of the wire bonding apparatus 10 (see FIG. 2) with a new one, set values of the capillary may change, based on the skill levels of the workers. A failure rate of manufactured products can increase due to variations in bonding caused by variations in set values of the capillary due to the skill levels of the workers. However, the capillary replacing unit 400 can replace a capillary without changing set values of the capillary. Thus, a product failure rate caused by replacing the capillary can be reduced or prevented.

Figure 10:
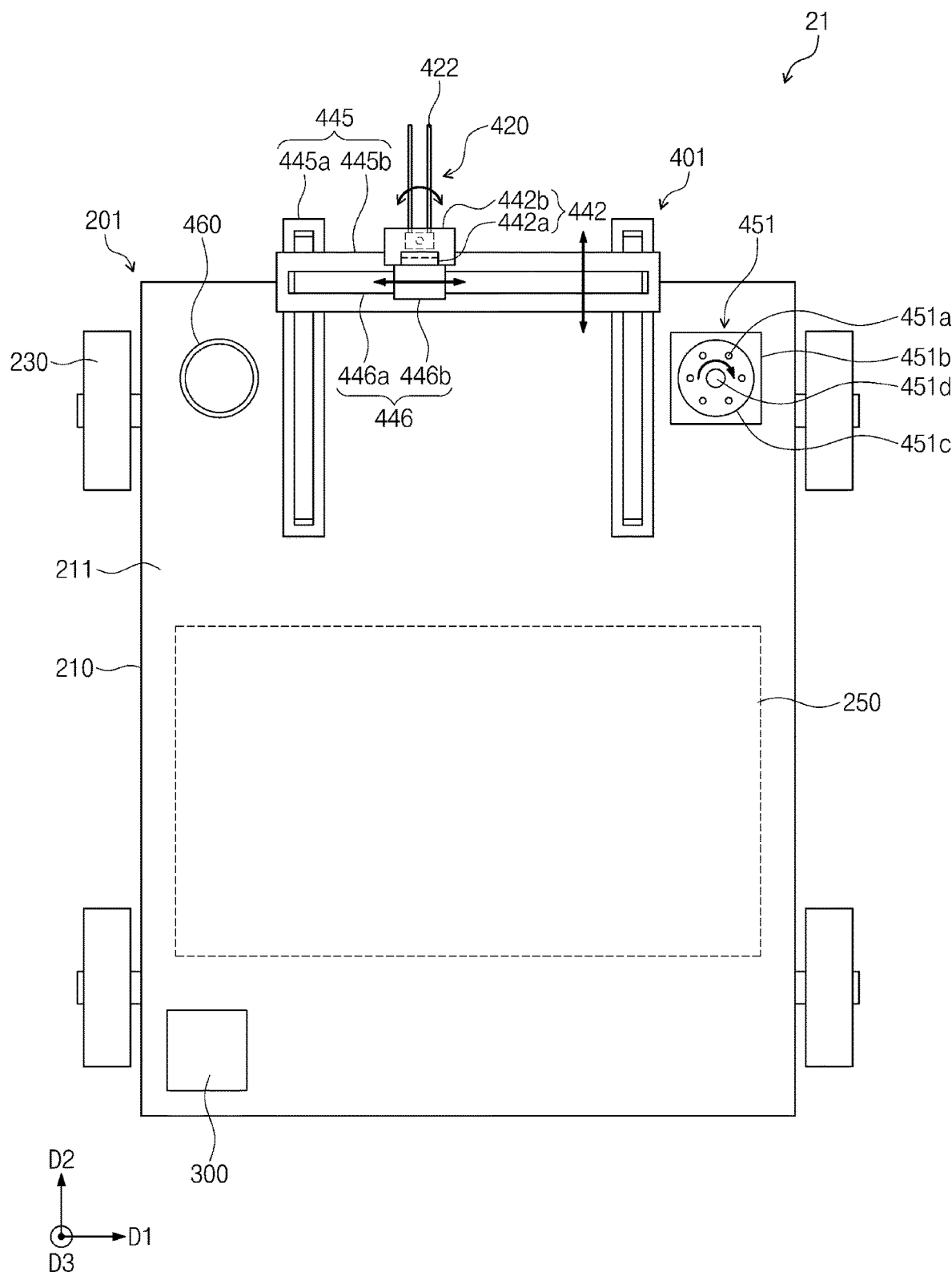
FIGS. 10 and 11 are schematic views that illustrate a modified example of a capillary replacing apparatus of FIG. 1.
Figure 11:
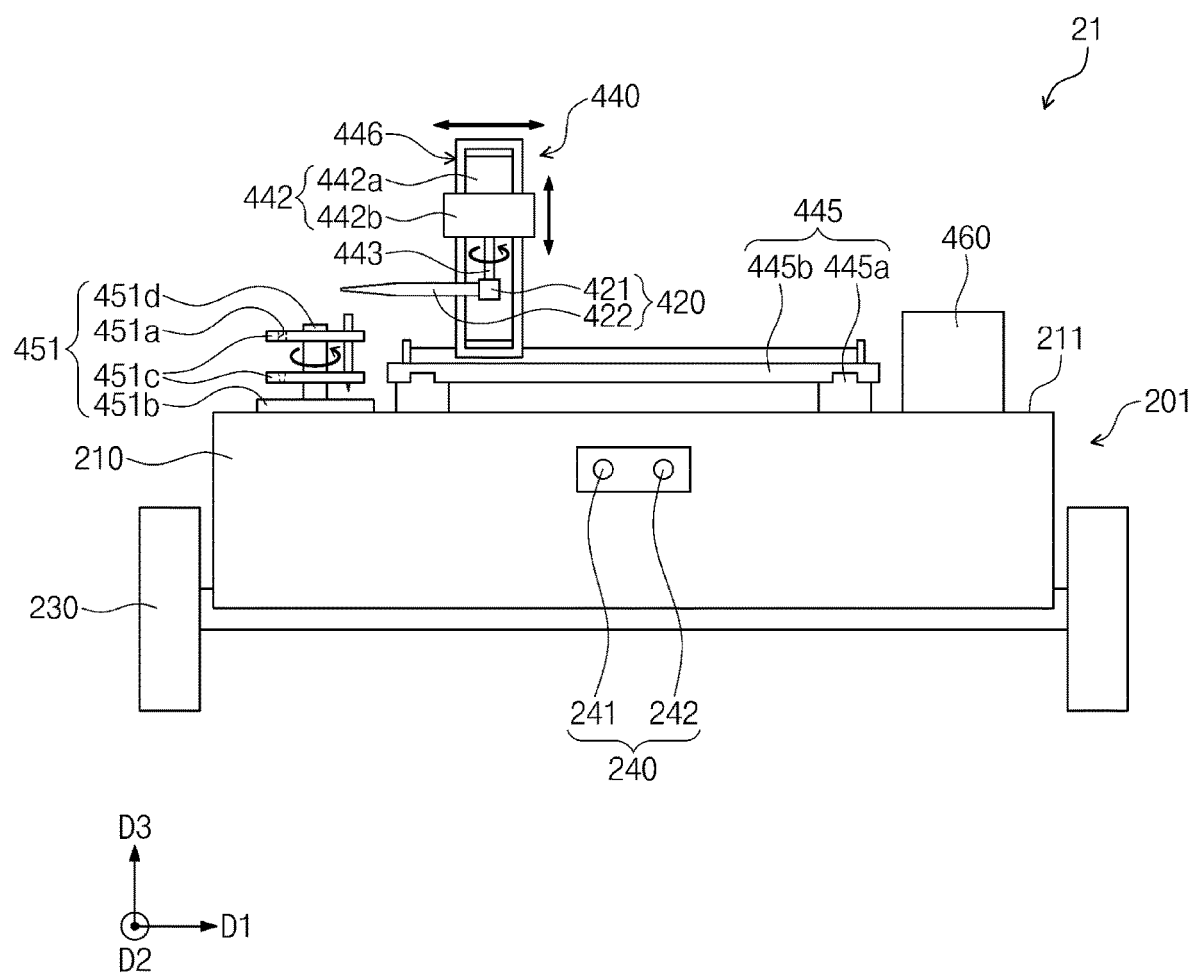
Figure 12:
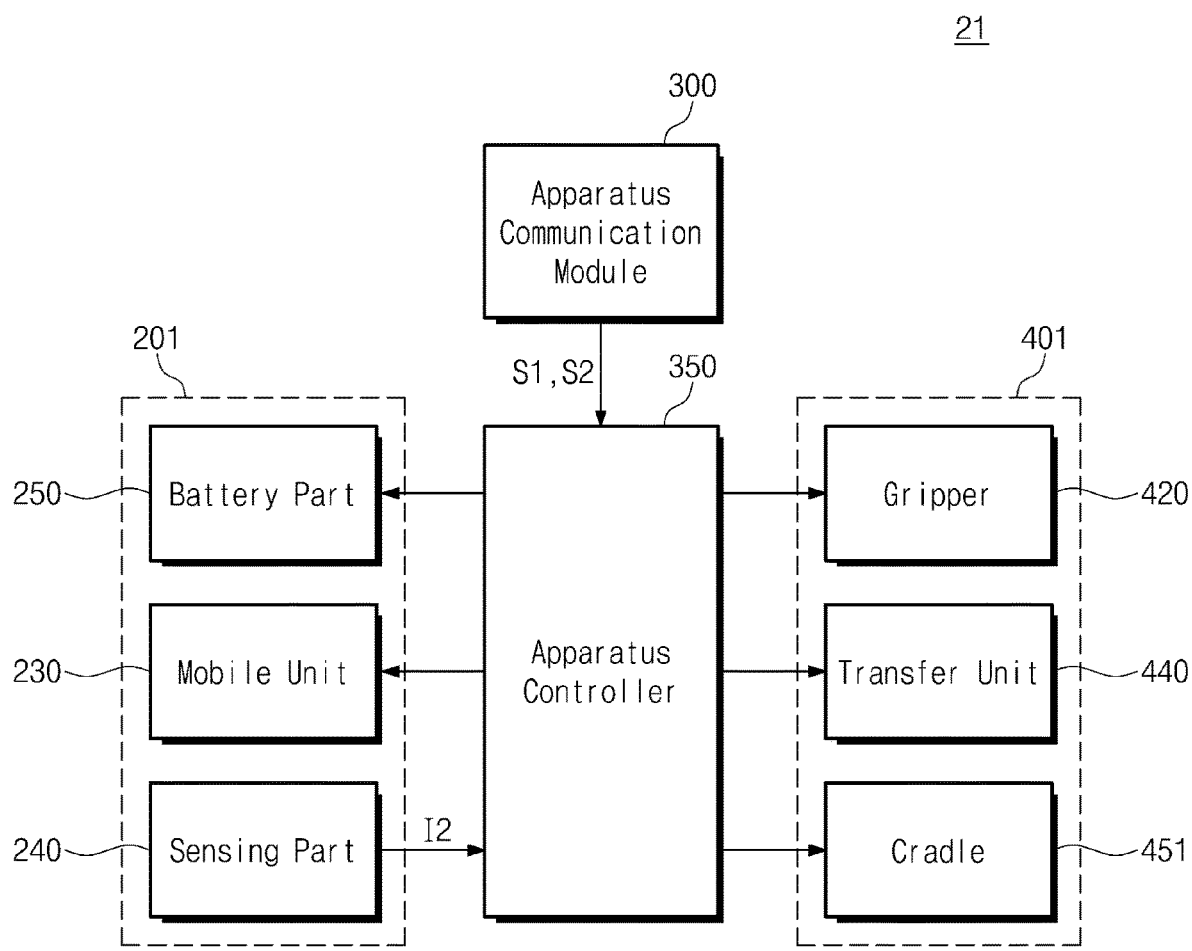
FIG. 12 is a block diagram that illustrates a capillary replacing apparatus of FIGS. 10 and 11.

FIGS. 10 and 11 are schematic views that illustrate a modified example of a capillary replacing apparatus of FIG. 1. FIG. 12 is a block diagram that illustrates a capillary replacing apparatus of FIGS. 10 and 11. For ease and convenience of explanation, descriptions of substantially the same components as in the embodiments of FIGS. 4A, 4B and 5 to 9 will be omitted or mentioned briefly in a present embodiment. FIG. 10 is a plan view that illustrates a capillary replacing apparatus, and FIG. 11 is a front view that illustrates a capillary replacing apparatus.

Referring to FIGS. 10 to 12, in some embodiments, a capillary replacing apparatus 21 includes a mobile robot 201, a capillary replacing unit 401, an apparatus controller 350, and an apparatus communication module 300. The capillary replacing unit 401 is installed on a body part 210 of the mobile robot 201, unlike the capillary replacing unit 400 of FIGS. 4A and 6.

In some embodiments, the mobile robot 201 includes the body part 210, a mobile unit 230, a sensing part 240, and a battery part 250. The capillary replacing unit 401 includes a gripper 420, a transfer unit 440, a cradle 451, and a collection container 460. The battery unit 250 supplies electrical energy to the mobile unit 230, the gripper 420, the transfer unit 440, and the cradle 451.

In some embodiments, the transfer unit 440 includes a first transfer part 445, a second transfer part 446, a grip elevating part 442, and a grip rotating part 443.

In some embodiments, the first transfer part 445 is installed on the body part 210. The first transfer part 445 moves the gripper 420 in a direction toward the wire bonding apparatus 10 or a direction away from the wire bonding apparatus 10. For example, the first transfer part 445 moves the gripper 420 parallel to the second direction D2. The first transfer part 445 includes a first transfer rail part 445a, a first transfer tray 445b, and a first driving part.

In some embodiments, the first transfer rail part 445a includes first and second rails spaced apart from each other. The first and second rails extend in the second direction D2. The second rail is spaced apart from the first rail in the first direction D1. The first and second rails are parallel to each other.

In some embodiments, the first transfer tray 445b is installed on the first transfer rail part 445a. The first transfer tray 445b extends in the first direction D1. The first transfer tray 445b is coupled to the first and second rails of the first transfer rail part 445a. The first transfer tray 445b is moved along the first transfer rail part 445a in the second direction D2 by the first driving part.

In some embodiments, the second transfer part 446 is installed on the first transfer part 445. The second transfer part 446 moves the gripper 420 parallel to the first direction D1. The second transfer part 446 includes a second transfer rail part 446a, a second transfer tray 446b, and a second driving part.

In some embodiments, the second transfer rail part 446a is positioned on the first transfer tray 445b. The second transfer rail part 446a extends in the first direction D1. The second transfer tray 446b is installed on the second transfer rail part 446a. The second transfer tray 446 extends in the third direction D3. For example, the second transfer tray 446b can have a bar shape. The second transfer tray 446b is moved along the second transfer rail part 446a by the second driving part.

In some embodiments, the grip elevating part 442 is installed on the second transfer part 446, such as the second transfer tray 446b. The grip elevating part 442 moves the gripper 420 parallel to the third direction D3. The grip elevating part 442 includes an elevating rail part 442a, an elevating tray 442b, and an elevating driving part. The elevating rail part 442a is positioned on the second transfer tray 446b. The elevating rail part 442a extends in the third direction D3.

In some embodiments, the cradle 451 is positioned adjacent to one end of the first transfer tray 445b and/or the second rail. The cradle 451 includes a support plate 451b, at least one insertion plate 451c, and a rotation driving part 451d.

In some embodiments, the support plate 451b is positioned on a top surface 211 of the body part 210. The insertion plate 451c has a plurality of holes 451a that penetrate the insertion plate 451c. A capillary can be inserted in each of the holes 451a. The insertion plate 451c has a circular disk shape. The holes 451a are positioned along the circumference of the insertion plate 451c. The rotation driving part 451d is coupled to a center of the insertion plate 451c. The rotation driving part 451d rotates the insertion plate 451c. Thus, one of the capillaries inserted in the holes 451a can be positioned closest to one end of the first transfer tray 445b and/or the second rail of the first transfer rail part 445a.

In some embodiments, the collection container 460 positioned adjacent to the other end of the first transfer tray 445b and/or the first rail of the first transfer rail part 445a.

In some embodiments, the apparatus communication module 300 communicates wirelessly with the server 30 of FIG. 1 or the wire bonding apparatus 10 of FIG. 1. Thus, the apparatus communication module 300 can receive the replacement start signal S1 and/or the replacement complete signal S2 from the wire bonding apparatus 10.

In some embodiments, the apparatus controller 350 controls the mobile robot 201 and the capillary replacing unit 401. For example, the apparatus controller 350 can control the driving of the mobile unit 230, the gripper 420, the transfer unit 440 and the cradle 450. The apparatus controller 350 receives the replacement start signal S1 or the replacement complete signal S2 through the apparatus communication module 300.

FIGS. 13 to 24 are schematic views that illustrate processes of replacing a capillary by a capillary replacing system of FIG. 1. FIGS. 25A and 25B illustrate second image information I2 (see FIG. 5) obtained by a sensing part of FIG. 14.

Referring to FIGS. 2A, 4A, 13, 14, and 15, in some embodiments, the mobile robot 200 transfers the capillary replacing unit 400 to the wire bonding apparatus 10 in response to the replacement start signal S1 of the capillary 121 received from the wire bonding apparatus 10.

In some embodiments, each of the wire bonding apparatuses 10 determines whether or not to replace the capillary installed therein. At least one of the wire bonding apparatuses 10 transmit the replacement start signal S1 of the capillary to the server 30 or the capillary replacing apparatus 20. For the purpose of ease and convenience in explanation, the wire bonding apparatus 10 that transmits the replacement start signal S1 can be defined as a first wire bonding apparatus. After transmitting the replacement start signal S1, the first wire bonding apparatus 10 stops a wire bonding process. For example, the first wire bonding apparatus 10 cuts an end of a wire provided from the capillary 121 and stops a supply of air toward the capillary. In addition, the clamp 122 clamps the wire W.

In some embodiments, the server 30 transmits the replacement start signal S1 received from the first wire bonding apparatus 10 to the capillary replacing apparatus 20.

In some embodiments, the capillary replacing apparatus 20 receives the replacement start signal S1 from of the first wire bonding apparatuses 10. For example, the mobile robot 200 on which the capillary replacing unit 400 is loaded can receive the replacement start signal S1 through the robot communication module 220.

In some embodiments, the mobile robot 200 transfers the capillary replacing unit 400 to the first wire bonding apparatus 10 in response to the replacement start signal S1. For example, the mobile robot 200 moves autonomously toward the first wire bonding apparatus 10 with the capillary replacing unit 400 loaded on the mobile robot 200.

In some embodiments, the mobile robot 200 is positioned to correspond to the first wire bonding apparatus 10. For example, the mobile robot 200 can autonomously move toward the first wire bonding apparatus 10 and position itself adjacent to the first wire bonding apparatus 10. The mobile robot 200 acquires an image of the position mark 15 of the first wire bonding apparatus 10 using the mark sensing unit 241. Thus, the mobile robot 200 obtains second image information I2. The mobile robot 200 can align itself to correspond to the first wire bonding apparatus 10 using the second image information I2.

In some embodiments, the process by which the mobile robot 200 aligns itself with the first wire bonding apparatus 10 will be described in more detail with reference to FIGS. 25A and 25B.

In some embodiments, as illustrated in FIG. 25A, the robot controller 270 extracts coordinates Y2 and Z2 of a reference point $C_2$ of the position mark 15 from the second image information I2. The reference point $C_2$ of the position mark 15 may be, but is not limited to, a central point of the position mark 15. The robot controller 270 determines whether at least one of the extracted coordinates Y2 and Z2 coincides with predetermined reference coordinates $C_1$. The reference coordinates $C_1$ include coordinates Y1 and Z1 In some embodiments, the extracted coordinates Y2 and Z2 may not coincide with the coordinates Y1 and Z1 of the reference coordinates $C_1$.

In some embodiments, an information code of the wire bonding apparatus 10 is displayed on the position mark 15. The information code may be a quick response (QR) code, a bar code, or a. DATA matrix. The information code includes information on a position of the loading area LA of the first wire bonding apparatus 10 and on the capillary. The robot controller 270 can recognize the information code from the second image information I2.

In some embodiments, as illustrated in FIG. 25B, the robot controller 270 controls the mobile unit 230 so that the extracted coordinates Y2 and Z2 coincide with at least one of the coordinates Y1 and Z1 of the reference coordinates $C_1$. The robot controller 270 controls the mobile unit 230 so that the extracted coordinates Y2 and Z2 coincide with the coordinates Y1 and Z1 of the reference coordinates $C_3$, respectively. Thus, the mobile robot 200 can align itself with the first wire bonding apparatus 10.

In some embodiments, the mobile robot 200, when aligned with the first wire bonding apparatus 10, picks up one of the loaded capillary replacing units 400. For example, the manipulator 260 picks up the capillary replacing unit 400 loaded on the body part 210. The mobile robot 200 positions the picked-up capillary replacing unit 400 on the loading area LA of the first wire bonding apparatus 10.

Figure 15:
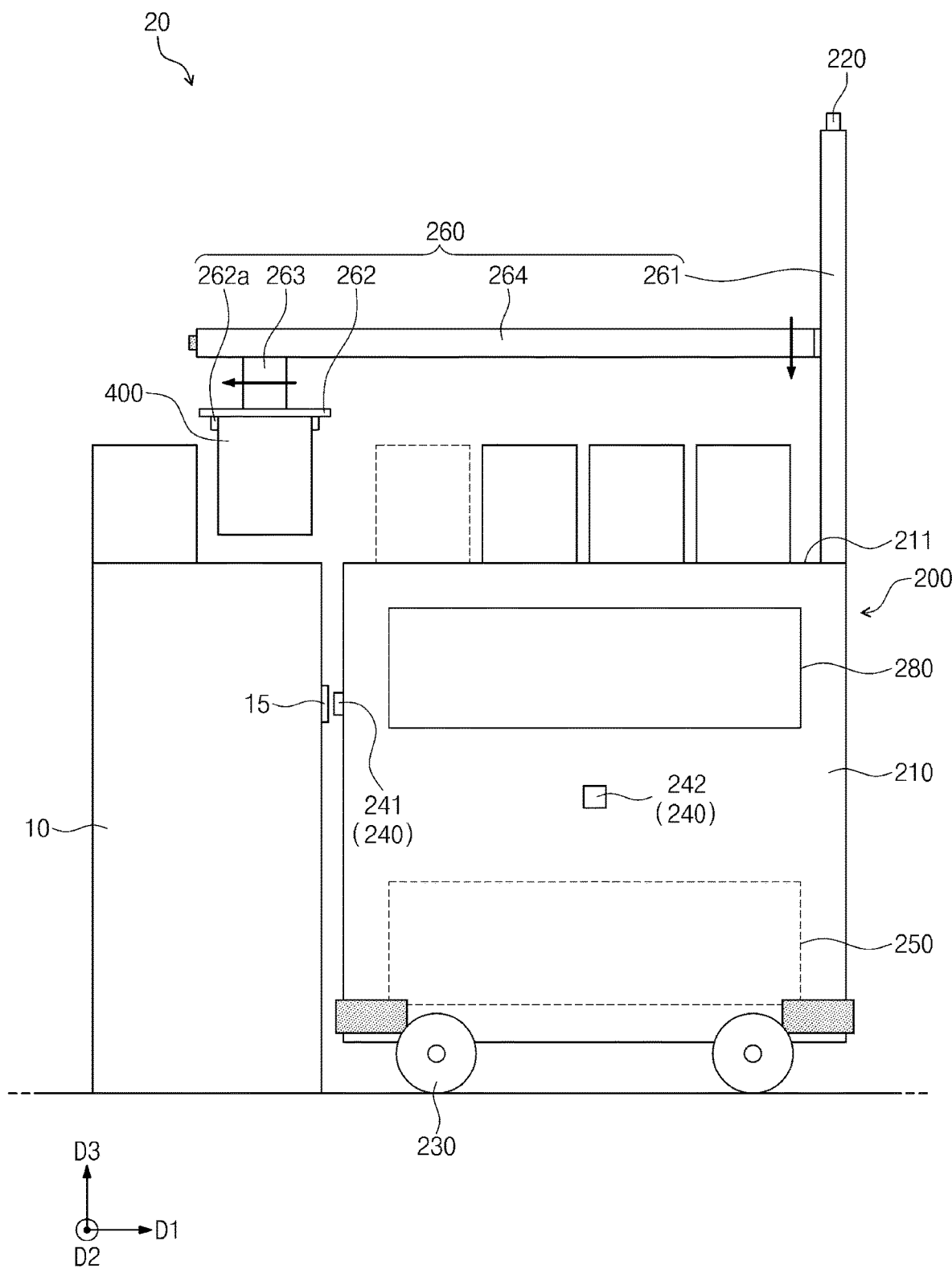
Figure 16:
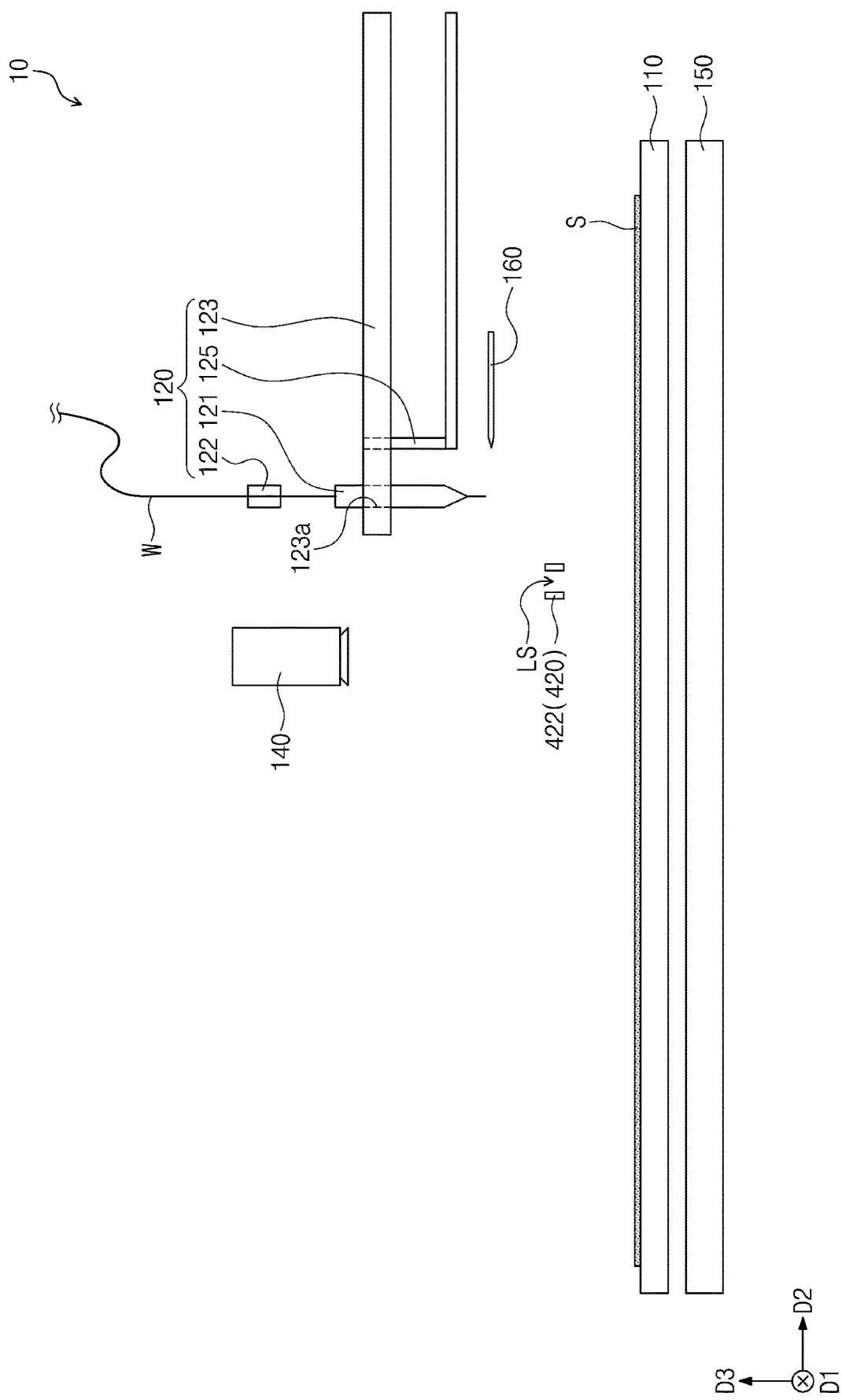

Referring to FIGS. 15 and 16, in some embodiments, since the capillary replacing unit 400 is positioned on the loading area LA of the first wire bonding apparatus 10, the gripper 420 of the capillary replacing unit 400 is positioned adjacent to the holding unit 123. The image acquisition unit 140 acquires an image of the grip members 422 of the gripper 420 adjacent to the holding unit 123 to obtain the first image information I1. The first image information I1 includes position information, hereinafter referred to as 'first position information', of the grip members 422.

Figure 17:
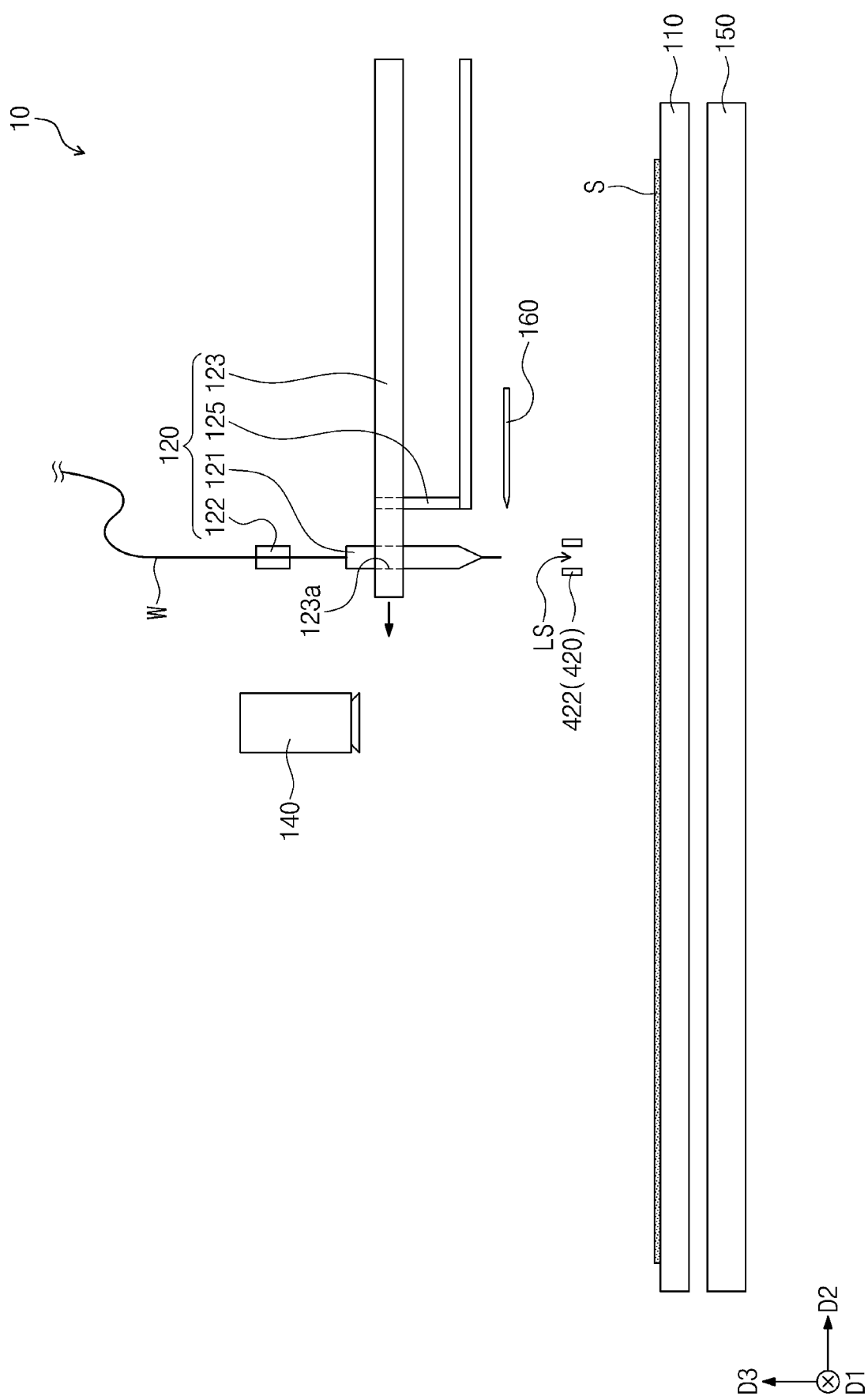

Referring to FIGS. 2B, 3, and 17, in some embodiments, the controller 180 of the first wire bonding apparatus 10 moves the holding unit 123 using the first position information. Thus, the holding unit 123 is aligned with the grip members 422. For example, the first insertion hole 123a is vertically aligned with the space LS between the grip members 422. The first insertion hole 123a vertically overlaps with the space LS. In other words, the capillary 121 held by the holding unit 123 vertically overlaps with the space LS.

Alternatively, in other embodiments, the capillary replacing unit 400 includes a unit communication module that communicates wirelessly. The controller 180 of the first wire bonding apparatus 10 generates a first position signal that includes the first position information. The first position signal is transmitted from the first wire bonding apparatus 10 by the communication module 170. The capillary replacing unit 400 receives the first position signal through the unit communication module. The unit controller 470 (see FIG. 7) moves the gripper 420 using the first position information. Thus, the space LS and the first insertion hole 123a can be aligned with each other.

Figure 18:
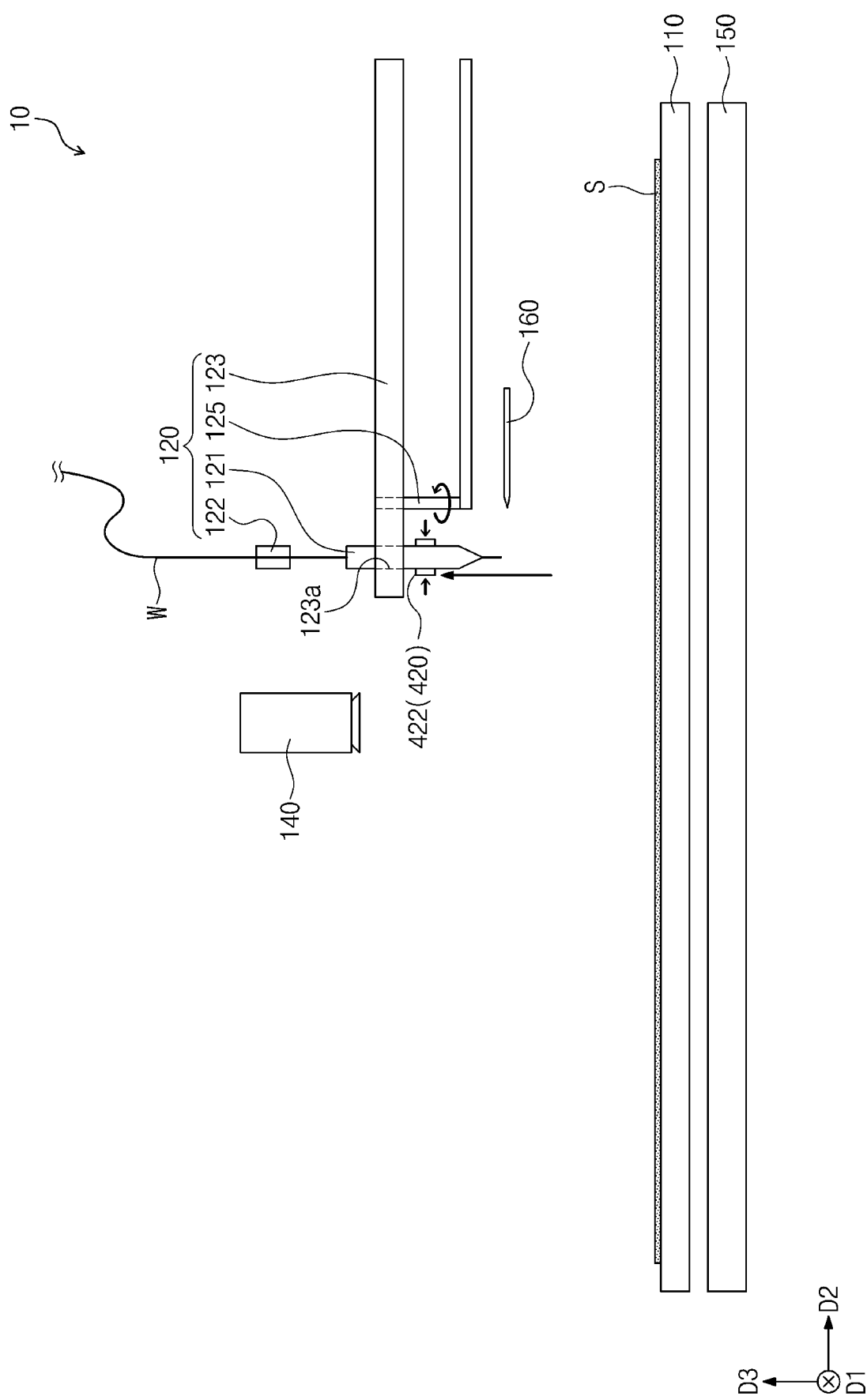

Referring to FIGS. 2B, 9, and 18, in some embodiments, the gripper 420 moves toward the holding unit 123. Thus, the capillary 121 held in the first insertion hole 123a is located in the space LS between the grip members 422.

In some embodiments, the gripper 420 moves to the holding unit 123 and then grips the capillary 121. For example, the grip driving part 423 reduces the distance L between the grip members 422. Thus, the gripper 420 can grip the capillary 121 located in the space LS.

In some embodiments, after the gripper 420 grips the capillary 121, the holding unit 123 releases the capillary 121. For example, the pin 125 of the holding unit 123 rotates to increase the diameter of the first insertion hole 123a. Thus, the capillary 121 can be separated from the holding unit 123.

Figure 19:
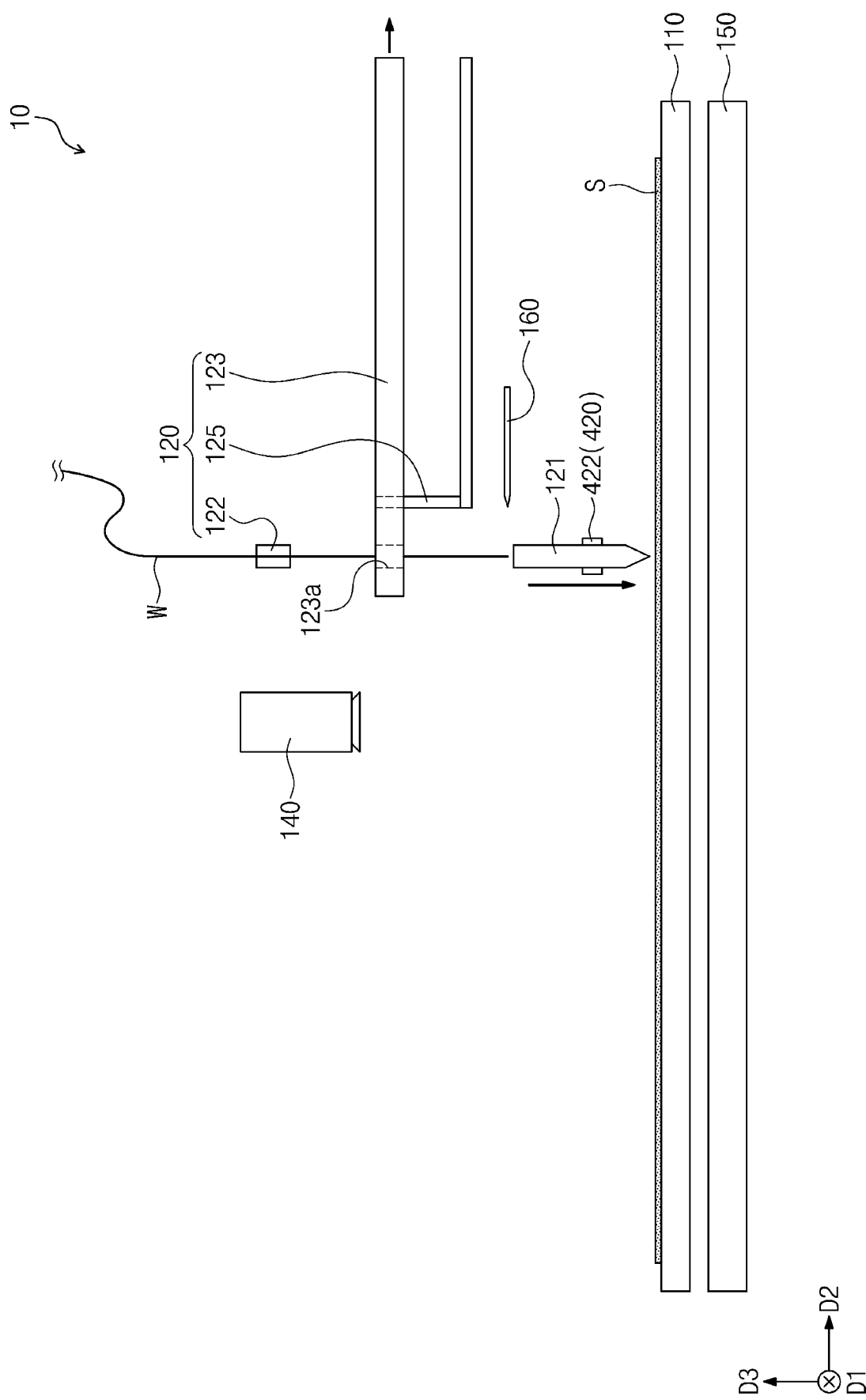

Referring to FIG. 19, in some embodiments, the gripper 420 is lowered toward the support member 110 while the gripper 420 grips the capillary 121. Thus, a wire W disposed in the capillary 121 can be separated from the capillary 121. As a result, the capillary replacing unit 400 separates the capillary 121 from the first wire bonding apparatus 10.

Figure 20:
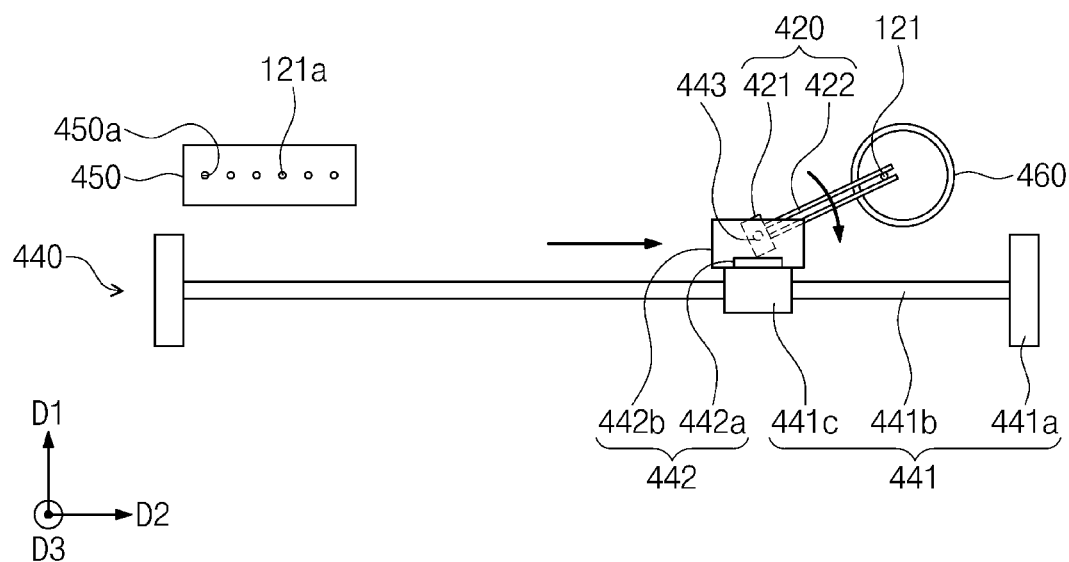

Referring to FIG. 20, in some embodiments, the gripper 420 moves toward the collection container 460. The capillary 121 gripped by the gripper 420 vertically overlaps with the collection container 460. The gripper 420 drops the capillary 121 into the collection container 460.

Figure 21:
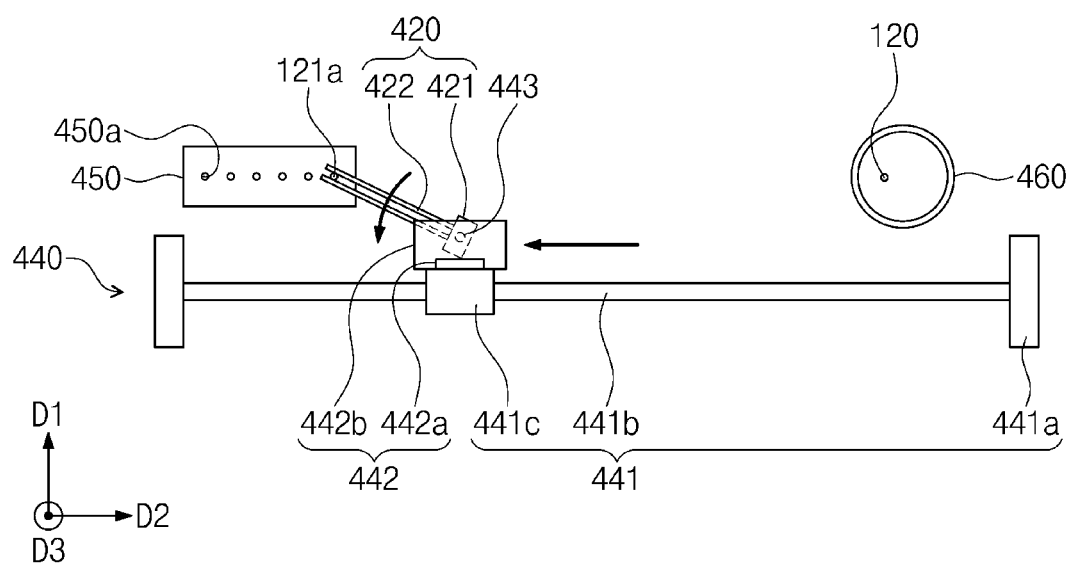
Figure 22:
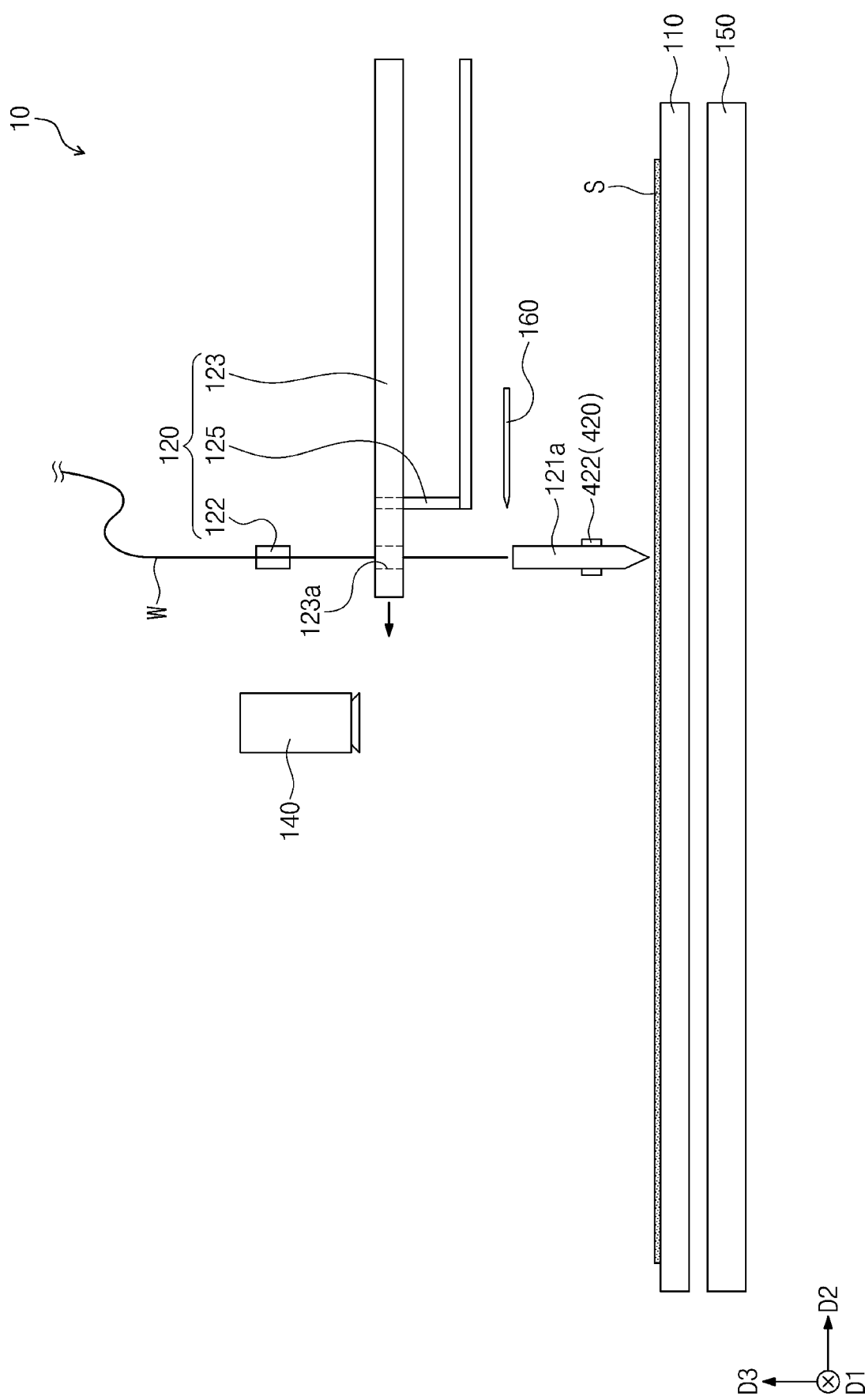

Referring to FIG. 21, in some embodiments, after dropping the capillary 121 into the collection container 460, the gripper 420 moves toward the cradle 450. The gripper 420 grips one of new capillaries 121a inserted in the holes 450a of the cradle 450.

Referring to FIGS. 2B, 3, 22, and 23, in some embodiments, the capillary replacing unit 400 installs the new capillary 121a in the first wire bonding apparatus 10 from which the capillary 121 was separated.

In some embodiments, the gripper 420 is positioned adjacent to the holding unit 123 after gripping the new capillary 121a. The image acquisition unit 140 acquires an image of the new capillary 121a gripped in the gripper 420 to obtain first image information I1. The first image information I1 includes position information, hereinafter referred to as 'second position information', of the new capillary 121a.

In some embodiments, the controller 180 of the first wire bonding apparatus 10 moves the holding unit 123 using the second position information. Thus, the first insertion hole 123a of the holding unit 123 can be aligned with the new capillary 121a. The first insertion hole 123a vertically overlaps with the new capillary 121a.

Alternatively, in other embodiments, the capillary replacing unit 400 includes a unit communication module that communicates wirelessly. The controller 180 of the first wire bonding apparatus 10 generates a second position signal that includes the second position information. The second position signal is transmitted from the first wire bonding apparatus 10 by the communication module 170. The capillary replacing unit 400 receives the second position signal from the unit communication module. The unit controller 470 (see FIG. 7) moves the gripper 420 using the second position information of the second position signal. Thus, the new capillary 121a can be aligned with the first insertion hole 123a.

Figure 23:
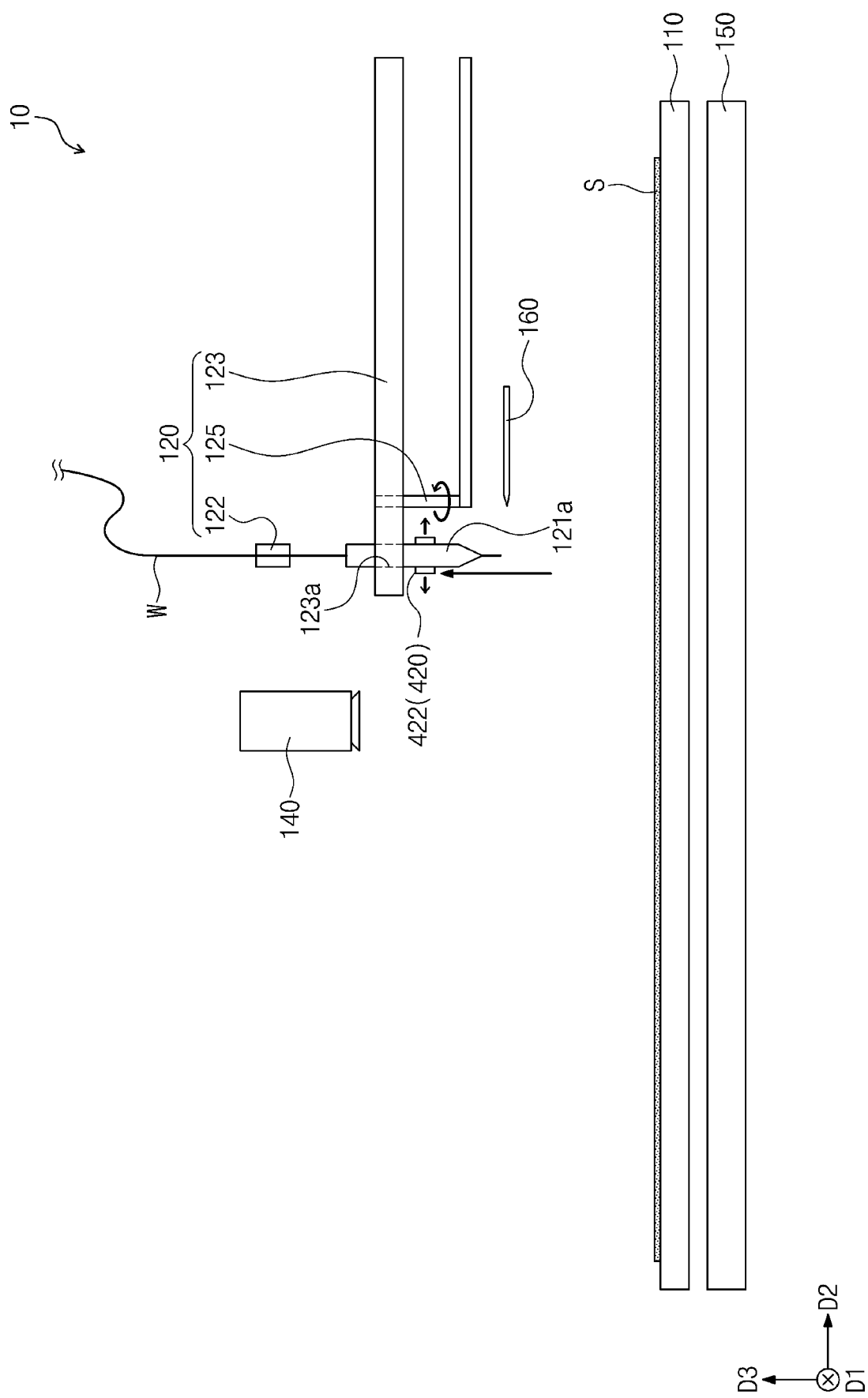

Referring to FIGS. 2B, 9, and 23, in some embodiments, after the new capillary 121a is aligned with the first insertion hole 123a, the gripper 420 moves toward the holding unit 123. Thus, the new capillary 121a can be inserted into the first insertion hole 123a. At this time, the wire W passes through the new capillary 121a.

In some embodiments, after the new capillary 121a is inserted in the first insertion hole 123a, the holding unit 123 holds the new capillary 121a in the first insertion hole 123a. For example, the pin 125 in the second insertion hole 123a rotates to reduce the diameter of the first insertion hole 123a. Thus, an inner sidewall of the first insertion hole 123a comes into contact with the new capillary 121a.

In some embodiments, after the holding unit 123 holds the new capillary 121a, the gripper 420 releases the new capillary 121a. For example, the grip driving part 423 increases the distance L between the grip members 422. After the gripper 420 releases the new capillary 121a, the gripper 420 moves toward the support member 110.

In some embodiments, after the new capillary 121a is held by the holding unit 123, the discharge unit 160 provides a discharge voltage to an end of a wire W provided from the new capillary 121a. Thus, a bump ball is formed at the end of the wire W. After the bump ball is formed at the end of the wire W, the discharge unit 160 provides the discharge voltage again.

In some embodiments, after the bump ball is formed at the end of the wire W, a transducer adjusts an ultrasonic vibration provided to the new capillary 121a. The bonding unit 120 bonds the bump ball to a specific area of the substrate S.

In some embodiments, the image acquisition unit 140 acquires an image of the bump ball bonded to the substrate S to obtain bonding-level information of the bump ball. The controller 180 of the first wire bonding apparatus 10 determines whether the bonding-level information corresponds to a predetermined set reference. For example, the controller 180 can determine whether the bonding-level information corresponds to the set reference through camera offset. The controller 180 can change the set reference using the bonding-level information. The controller 180 can reset the information on use of the capillary.

Figure 24:
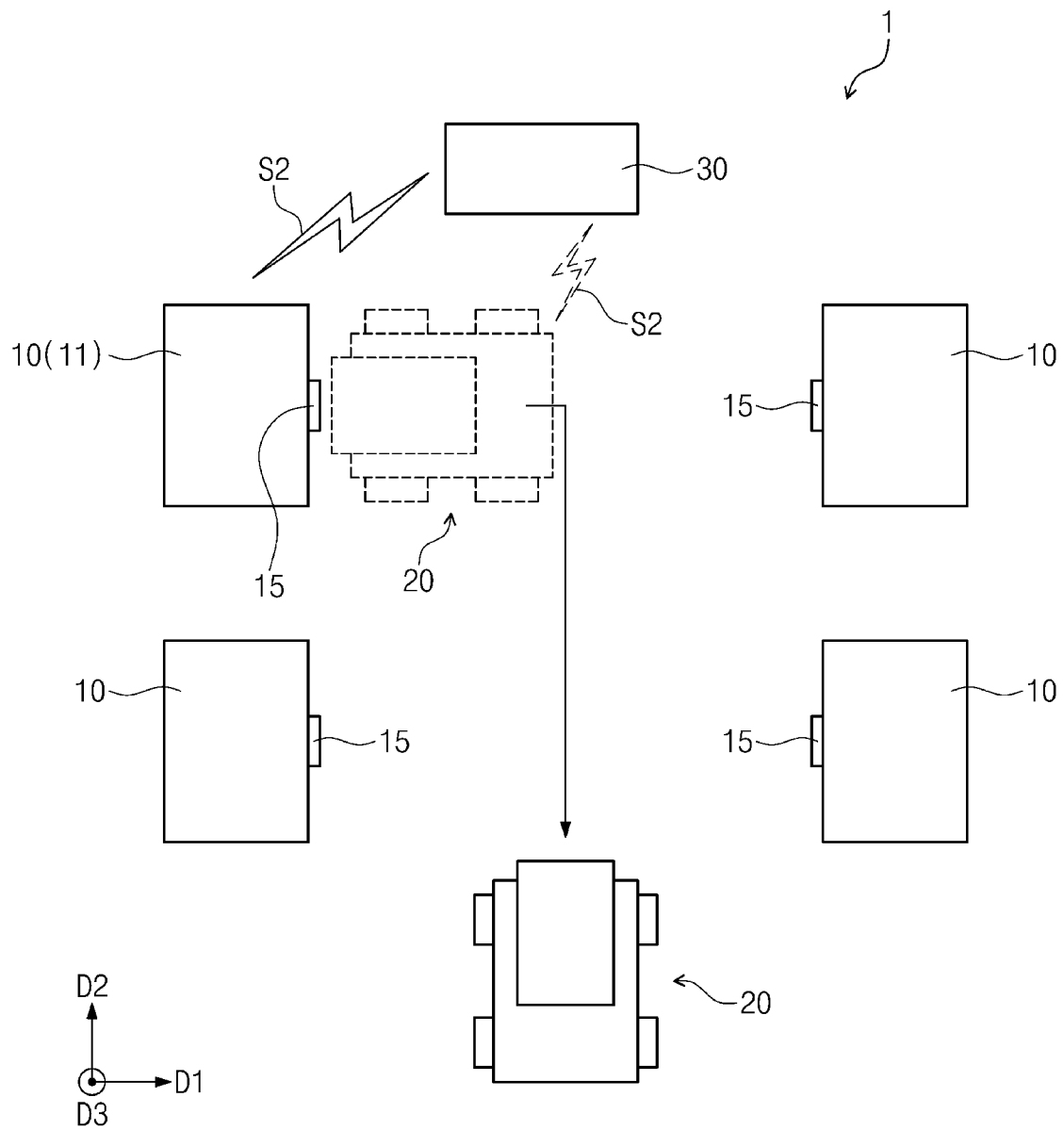
Figure 25A:
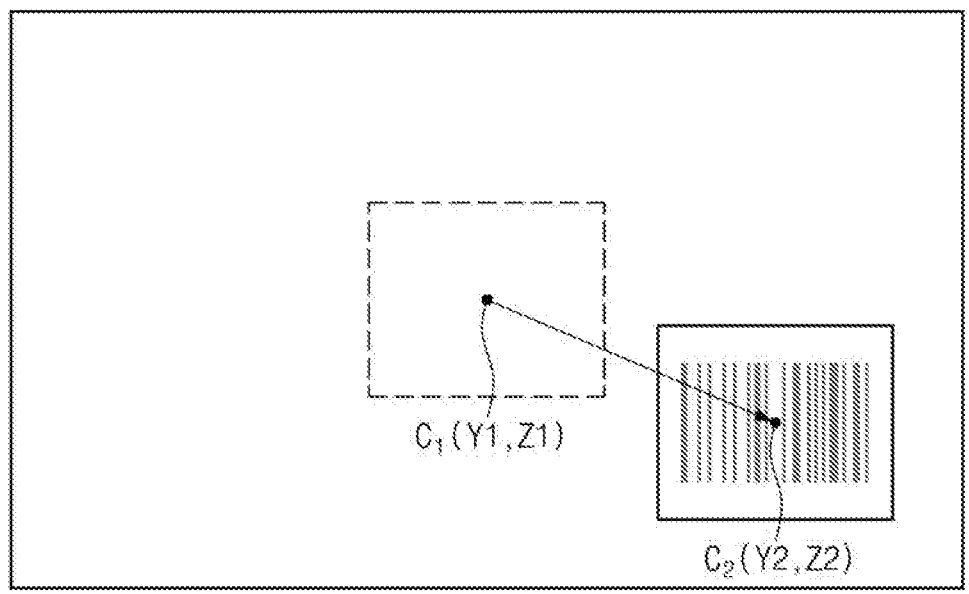
FIGS. 25A and 25B illustrate second image information obtained by a sensing part of FIG. 14.
Figure 25B:
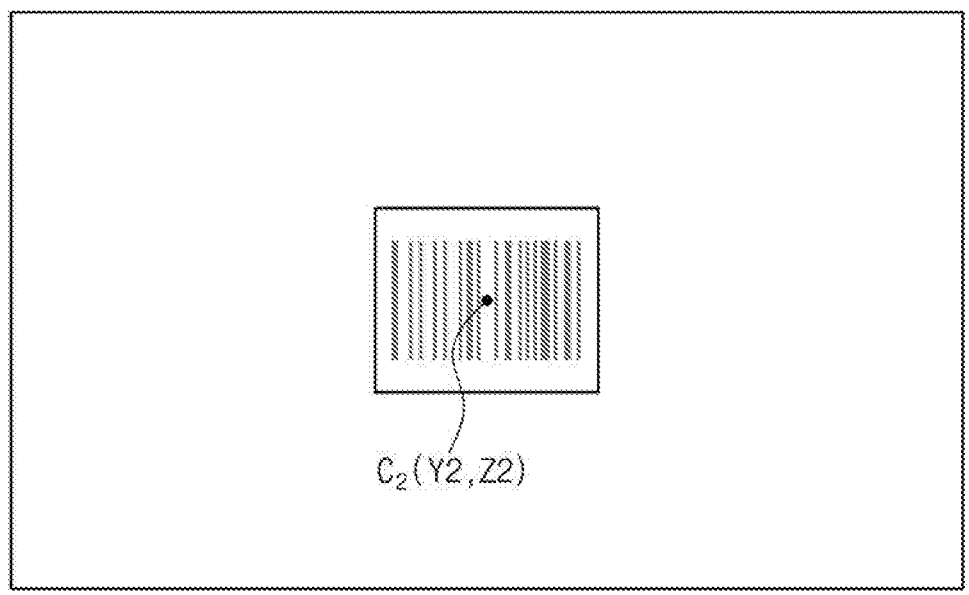

Referring to FIGS. 15 and 24, in some embodiments, after the capillary replacing unit 400 installs the new capillary 121a of FIG. 23, the mobile robot 200 moves the capillary replacing unit 400 back to its original position. For example, the controller 180 of the first wire bonding apparatus 10 generates the replacement complete signal S2 after changing the set reference or resetting the information on use of the capillary. The replacement complete signal S2 is transmitted to the server 30 by the communication module 170 of FIG. 3.

In some embodiments, the mobile robot 200 receives the replacement complete signal S2 from the server 30. After receiving the replacement complete signal S2, the manipulator 260 of the mobile robot 200 picks up the capillary replacing unit 400 from the loading area LA. The manipulator 260 loads the picked-up capillary replacing unit 400 onto the top surface 211 of the body part 210. The mobile robot 200 moves autonomously to its original position after the capillary replacing unit 400 has been loaded back onto the mobile robot 200.

According to some embodiments of the inventive concepts, a capillary replacing apparatus can automatically replace a capillary of a wire bonding apparatus when replacement of the capillary of the wire bonding apparatus is needed. Since the capillary is automatically replaced, the capillary replacement time can be reduced. In addition, since the capillary is automatically replaced, a product failure rate, which may be caused by the capillary replacement can be reduced.

While embodiments of the inventive concepts have been described with reference to exemplary embodiments thereof, it will be apparent to those skilled in the art that various changes and modifications may be made without departing from the spirits and scopes of the inventive concepts. Therefore, it should be understood that the exemplary embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for replacing a capillary of a wire bonding apparatus that includes a holding unit that holds a capillary, the method comprising:
    transferring a capillary replacing unit to the wire bonding apparatus by a mobile robot in response to receiving a capillary replacement start signal from the wire bonding apparatus;
    separating, by the capillary replacing unit, the capillary corresponding to the replacement start signal from the wire bonding apparatus;
    acquiring, by the wire bonding apparatus, an image of a new capillary gripped in a gripper of the capillary replacing unit to obtain position information of the new capillary;
    aligning an insertion hole of the holding unit and the new capillary with each other using the position information, and
    installing, by the capillary replacing unit, the new capillary in the wire bonding apparatus.

2. The method of claim 1, wherein transferring the capillary replacing unit comprises:
    transmitting the replacement start signal to the mobile robot on which the capillary replacing unit is loaded;
    positioning the mobile robot wherein the mobile robot corresponds to the wire bonding apparatus that transmitted the replacement start signal; and
    transferring the capillary replacing unit from the mobile robot onto a loading area of the wire bonding apparatus.

3. The method of claim 2, wherein positioning the mobile robot comprises:
    autonomously moving the mobile robot toward the wire bonding apparatus to position the mobile robot adjacent to the wire bonding apparatus;
    acquiring, by the mobile robot, an image of a position mark of the adjacent wire bonding apparatus to obtain image information; and
    aligning the mobile robot with the wire bonding apparatus using the image information.

4. The method of claim 1,
    wherein installing the new capillary comprises:
    inserting the new capillary into the insertion hole of the holding unit; and
    holding, by the holding unit, the new capillary in the insertion hole.

5. The method of claim 4, wherein aligning the insertion hole and the new capillary comprises:
    moving the holding unit using the position information wherein the insertion hole and the new capillary vertically overlap each other.

6. The method of claim 4, wherein aligning the insertion hole and the new capillary comprises:
    moving the gripper using the position information wherein the insertion hole and the new capillary vertically overlap each other.

7. The method of claim 1, further comprising:
    transmitting the replacement start signal from the wire bonding apparatus when at least one of a capillary use time or a number of uses of the capillary corresponds to a predetermined reference value.

8. The method of claim 1,
    wherein separating the capillary comprises:
    acquiring, by the wire bonding apparatus, an image of a pair of grip members of a gripper of the capillary replacing unit to obtain position information of the grip members;
    aligning a space between the grip members and an insertion hole of the holding unit into which the capillary is inserted with each other using the position information;
    positioning the capillary in the insertion hole within the space;
    gripping the capillary in the space by the gripper; and
    releasing, by the holding unit, the capillary being gripped by the gripper.

9. The method of claim 1, further comprising:
    locating the capillary replacing unit to an original position by the mobile robot after the installing of the new capillary.

10. A method for replacing a capillary of a wire bonding apparatus using a capillary replacing unit loaded on a mobile robot, the method comprising:
    receiving a capillary replacement start signal from at least one of a plurality of wire bonding apparatuses;
    autonomously moving the mobile robot that received the replacement start signal to the wire bonding apparatus that transmitted the replacement start signal to load the capillary replacing unit onto the wire bonding apparatus;
    separating, by the capillary replacing unit, the capillary corresponding to the replacement start signal from the wire bonding apparatus; and
    installing, by the capillary replacing unit, a new capillary in the wire bonding apparatus.

11. The method of claim 10, wherein autonomously moving the mobile robot to load the capillary replacing unit comprises:
    positioning the mobile robot wherein the mobile robot is adjacent to the wire bonding apparatus that transmitted the replacement start signal; and
    transferring the capillary replacing unit from the mobile robot onto a loading area of the wire bonding apparatus.

12. The method of claim 10,
    wherein installing the new capillary comprises:

acquiring, by the wire bonding apparatus, an image of the new capillary gripped in a gripper of the capillary replacing unit to obtain position information of the new capillary;

aligning an insertion hole of the holding unit and the new capillary with each other using the position information;

inserting the new capillary into the insertion hole of the holding unit; and holding, by the holding unit, the new capillary in the insertion hole.

13. The method of claim 12, wherein aligning the insertion hole and the new capillary comprises;

moving the holding unit using the position information wherein the insertion hole and the new capillary vertically overlap each other.

14. The method of claim 10, wherein the wire bonding apparatus includes a holding unit holding a capillary, wherein separating the capillary comprises:

acquiring, by the wire bonding apparatus, an image of a pair of grip members of a gripper of the capillary replacing unit to obtain position information of the grip members;

aligning a space between the grip members and an insertion hole of a holding unit of the wire bonding apparatus in which a capillary is inserted with each other using the position information;

positioning the capillary in the insertion hole into the space;

gripping, by the gripper, the capillary in the space; and releasing, by the holding unit, the capillary being gripped in the gripper.

15. The method of claim 10, further comprising:

transmitting the replacement start signal from the wire bonding apparatus when at least one of a capillary use time or a number of uses of the capillary corresponds to a predetermined reference value.

* * * * *